(12) United States Patent
Lin et al.

(10) Patent No.: US 8,203,167 B2
(45) Date of Patent: Jun. 19, 2012

(54) SEMICONDUCTOR CHIP ASSEMBLY WITH POST/BASE HEAT SPREADER AND ADHESIVE BETWEEN BASE AND TERMINAL

(75) Inventors: Charles W. C. Lin, Singapore (SG); Chia-Chung Wang, Hsinchu (TW)

(73) Assignee: Bridge Semiconductor Corporation, Taipei (TW)

( * ) Notice: Subject to any disclaimer, the term of this patent is extended or adjusted under 35 U.S.C. 154(b) by 230 days.

(21) Appl. No.: 12/833,945

(22) Filed: Jul. 10, 2010

(65) Prior Publication Data

US 2010/0289054 A1 Nov. 18, 2010

Related U.S. Application Data

(63) Continuation-in-part of application No. 12/642,795, filed on Dec. 19, 2009, which is a continuation-in-part of application No. 12/616,773, filed on Nov. 11, 2009, now Pat. No. 8,067,784, and a continuation-in-part of application No. 12/616,775, filed on Nov. 11, 2009, said application No. 12/616,773 is a continuation-in-part of application No. 12/557,540, filed on Sep. 11, 2009, which is a continuation-in-part of application No. 12/406,510, filed on Mar. 18, 2009, said application No. 12/616,773 is a continuation-in-part of application No. 12/557,541, filed on Sep. 11, 2009, now Pat. No. 7,948,076, which is a continuation-in-part of application No. 12/406,510, said application No. 12/616,775 is a continuation-in-part of application No. 12/557,540, and a continuation-in-part of application No. 12/557,541, filed on Sep. 11, 2009, now Pat. No. 7,948,076.

(60) Provisional application No. 61/303,663, filed on Feb. 11, 2010, provisional application No. 61/257,830, filed on Nov. 3, 2009, provisional application No. 61/071,589, filed on May 7, 2008, provisional application No. 61/071,588, filed on May 7, 2008, provisional application No. 61/071,072, filed on Apr. 11, 2008, provisional application No. 61/064,748, filed on Mar. 25, 2008, provisional application No. 61/150,980, filed on Feb. 9, 2009.

(51) Int. Cl.
H01L 33/62 (2010.01)
H01L 23/36 (2006.01)
H01L 23/48 (2006.01)
H01L 33/64 (2010.01)

(52) U.S. Cl. ........................................................ 257/99

(58) Field of Classification Search .................. 257/99, 257/E33.056, E33.066, E23.101, E23.102, 257/E23.01, 707, 713, 784, 684, 712, 711, 257/E33.075; 438/26, 27, 122, 39, 121, 118, 438/464, 669, 670

See application file for complete search history.

(56) References Cited

U.S. PATENT DOCUMENTS 3,689,993 A 9/1972 Tolar .............................. 438/380

(Continued)

FOREIGN PATENT DOCUMENTS

JP 2005-166775 6/2005

*Primary Examiner* — Dao H Nguyen
*Assistant Examiner* — Tram H Nguyen
(74) *Attorney, Agent, or Firm* — Jackson IPG PLLC; Demian K. Jackson

(57) ABSTRACT

A semiconductor chip assembly includes a semiconductor device, a heat spreader, a conductive trace and an adhesive. The semiconductor device is electrically connected to the conductive trace and thermally connected to the heat spreader. The heat spreader includes a thermal post and a base. The thermal post extends upwardly from the base into a first opening in the adhesive, and the base extends laterally from the thermal post. The conductive trace includes a pad, a terminal and a signal post. The signal post extends upwardly from the terminal into a second opening in the adhesive. The adhesive extends above the base and between the base and the terminal.

35 Claims, 18 Drawing Sheets

U.S. PATENT DOCUMENTS

| | | | |
|---|---|---|---|
| 3,969,199 A | 7/1976 | Berdan et al. | 205/177 |
| 4,420,767 A | 12/1983 | Hodge et al. | 257/713 |
| 4,509,096 A | 4/1985 | Baldwin et al. | 257/706 |
| 5,012,386 A * | 4/1991 | McShane et al. | 361/715 |
| 5,102,829 A * | 4/1992 | Cohn | 29/837 |
| 5,379,187 A | 1/1995 | Lee et al. | 361/707 |
| 5,457,605 A | 10/1995 | Wagner et al. | 361/720 |
| 5,543,586 A | 8/1996 | Crane, Jr. et al. | 174/262 |
| 5,644,163 A | 7/1997 | Tsuji | 257/706 |
| 5,991,156 A | 11/1999 | Bond et al. | 361/707 |
| 6,057,601 A * | 5/2000 | Lau et al. | 257/738 |
| 6,160,705 A | 12/2000 | Stearns et al. | 361/704 |
| 6,162,664 A | 12/2000 | Kim | 438/126 |
| 6,281,568 B1 | 8/2001 | Glenn et al. | 257/684 |
| 6,313,525 B1 * | 11/2001 | Sasano | 257/704 |
| 6,453,549 B1 | 9/2002 | Bhatt et al. | 29/837 |
| 6,495,914 B1 | 12/2002 | Sekine et al. | 257/723 |
| 6,498,355 B1 | 12/2002 | Harrah et al. | 257/99 |
| 6,507,102 B2 | 1/2003 | Juskey et al. | 257/406 |
| 6,528,882 B2 | 3/2003 | Ding et al. | 257/738 |
| 6,541,832 B2 | 4/2003 | Coyle | 257/415 |
| 6,583,444 B2 | 6/2003 | Fjelstad | 257/82 |
| 6,603,209 B1 | 8/2003 | DiStefano et al. | 257/781 |
| 6,608,376 B1 | 8/2003 | Liew et al. | 257/698 |
| 6,625,028 B1 | 9/2003 | Dove et al. | 361/707 |
| 6,670,219 B2 | 12/2003 | Lee et al. | 438/107 |
| 6,683,795 B1 | 1/2004 | Yoo | 361/816 |
| 6,720,651 B2 | 4/2004 | Gaku et al. | 257/707 |
| 6,744,135 B2 | 6/2004 | Hasebe et al. | 257/712 |
| 6,861,750 B2 | 3/2005 | Zhao et al. | 257/739 |
| 6,900,535 B2 | 5/2005 | Zhou | 257/707 |
| 6,906,414 B2 | 6/2005 | Zhao et al. | 257/707 |
| 6,936,855 B1 | 8/2005 | Harrah | 257/88 |
| 6,964,877 B2 | 11/2005 | Chen et al. | 438/20 |
| 7,038,311 B2 | 5/2006 | Woodall et al. | 257/706 |
| 7,196,403 B2 | 3/2007 | Karim | 257/675 |
| 7,335,522 B2 | 2/2008 | Wang et al. | 438/26 |
| 7,470,935 B2 | 12/2008 | Lee et al. | 257/98 |
| 7,495,322 B2 | 2/2009 | Hashimoto et al. | 257/676 |
| 7,582,951 B2 | 9/2009 | Zhao et al. | 257/660 |
| 7,642,137 B2 | 1/2010 | Lin et al. | 438/127 |
| 7,690,817 B2 | 4/2010 | Sanpei et al. | 362/294 |
| 7,741,158 B2 * | 6/2010 | Leung et al. | 438/122 |
| 7,781,266 B2 | 8/2010 | Zhao et al. | 438/123 |
| 7,808,087 B2 | 10/2010 | Zhao et al. | 257/670 |
| 7,812,360 B2 | 10/2010 | Yano | 257/98 |
| 7,956,372 B2 | 6/2011 | Kamada et al. | 257/98 |
| 8,030,676 B2 | 10/2011 | Lin | 257/99 |
| 8,071,998 B2 | 12/2011 | Chen | 257/99 |
| 2003/0189830 A1 | 10/2003 | Sugimoto et al. | 362/294 |
| 2004/0061433 A1 | 4/2004 | Izuno et al. | 313/498 |
| 2004/0065894 A1 | 4/2004 | Hashimoto et al. | 257/100 |
| 2005/0024834 A1 | 2/2005 | Newby | 361/719 |
| 2005/0135105 A1 | 6/2005 | Teixeira et al. | 362/294 |
| 2005/0185880 A1 | 8/2005 | Asai | 385/14 |
| 2005/0274959 A1 | 12/2005 | Kim et al. | 257/79 |
| 2006/0012967 A1 | 1/2006 | Asai et al. | 361/764 |
| 2006/0054915 A1 | 3/2006 | Chang | 257/100 |
| 2006/0109632 A1 | 5/2006 | Berlin et al. | 361/719 |
| 2006/0131735 A1 | 6/2006 | Ong et al. | 257/706 |
| 2007/0063213 A1 | 3/2007 | Hsieh et al. | 257/99 |
| 2007/0077416 A1 | 4/2007 | Ito et al. | 428/339 |
| 2007/0090522 A1 | 4/2007 | Alhayek et al. | 257/723 |
| 2007/0252166 A1 | 11/2007 | Chang et al. | 257/98 |
| 2007/0267642 A1 | 11/2007 | Erchak et al. | 257/98 |
| 2007/0290322 A1 | 12/2007 | Zhao et al. | 257/690 |
| 2008/0019133 A1 | 1/2008 | Kim et al. | 362/294 |
| 2008/0099770 A1 | 5/2008 | Mendendorp et al. | 257/79 |
| 2008/0102631 A1 | 5/2008 | Andryushchenko et al. | 438/686 |
| 2008/0173884 A1 | 7/2008 | Chitnis et al. | 257/98 |
| 2008/0180824 A1 | 7/2008 | Endoh et al. | 359/894 |
| 2009/0309213 A1 | 12/2009 | Takahashi et al. | 257/707 |
| 2010/0149756 A1 | 6/2010 | Rowcliffe et al. | 361/714 |
| 2010/0291737 A1 | 11/2010 | Ikeguchi et al. | 438/108 |
| 2011/0133204 A1 | 6/2011 | Lai | 257/76 |

* cited by examiner

SEMICONDUCTOR CHIP ASSEMBLY WITH POST/BASE HEAT SPREADER AND ADHESIVE BETWEEN BASE AND TERMINAL

CROSS-REFERENCE TO RELATED APPLICATIONS

This application is a continuation-in-part of U.S. application Ser. No. 12/642,795 filed Dec. 19, 2009. This application also claims the benefit of U.S. Provisional Application Ser. No. 61/303,663 filed Feb. 11, 2010, which is incorporated by reference.

U.S. application Ser. No. 12/642,795 filed Dec. 19, 2009 is a continuation-in-part of U.S. application Ser. No. 12/616,773 filed Nov. 11, 2009 now U.S. Pat. No. 8,067,784 and U.S. application Ser. No. 12/616,775 filed Nov. 11, 2009, each of which is incorporated by reference. U.S. application Ser. No. 12/642,795 filed Dec. 19, 2009 also claims the benefit of U.S. Provisional Application Ser. No. 61/257,830 filed Nov. 3, 2009, which is incorporated by reference.

U.S. application Ser. No. 12/616,773 filed Nov. 11, 2009 and U.S. application Ser. No. 12/616,775 filed Nov. 11, 2009 are each a continuation-in-part of U.S. application Ser. No. 12/557,540 filed Sep. 11, 2009 and a continuation-in-part of U.S. application Ser. No. 12/557,541 filed Sep. 11, 2009 now U.S. Pat. No. 7,948,076.

U.S. application Ser. No. 12/557,540 filed Sep. 11, 2009 and U.S. application Ser. No. 12/557,541 filed Sep. 11, 2009 are each a continuation-in-part of U.S. application Ser. No. 12/406,510 filed Mar. 18, 2009, which claims the benefit of U.S. Provisional Application Ser. No. 61/071,589 filed May 7, 2008, U.S. Provisional Application Ser. No. 61/071,588 filed May 7, 2008, U.S. Provisional Application Ser. No. 61/071,072 filed Apr. 11, 2008, and U.S. Provisional Application Ser. No. 61/064,748 filed Mar. 25, 2008, each of which is incorporated by reference. U.S. application Ser. No. 12/557,540 filed Sep. 11, 2009 and U.S. application Ser. No. 12/557,541 filed Sep. 11, 2009 also claim the benefit of U.S. Provisional Application Ser. No. 61/150,980 filed Feb. 9, 2009, which is incorporated by reference.

BACKGROUND OF THE INVENTION

1. Field of the Invention

The present invention relates to semiconductor chip assembly, and more particularly to a semiconductor chip assembly with a semiconductor device, a conductive trace, an adhesive and a heat spreader and its method of manufacture.

2. Description of the Related Art

Semiconductor devices such as packaged and unpackaged semiconductor chips have high voltage, high frequency and high performance applications that require substantial power to perform the specified functions. As the power increases, the semiconductor device generates more heat. Furthermore, the heat build-up is aggravated by higher packing density and smaller profile sizes which reduce the surface area to dissipate the heat.

Semiconductor devices are susceptible to performance degradation as well as short life span and immediate failure at high operating temperatures. The heat not only degrades the chip, but also imposes thermal stress on the chip and surrounding elements due to thermal expansion mismatch. As a result, the heat must be dissipated rapidly and efficiently from the chip to ensure effective and reliable operation. A high thermal conductivity path typically requires heat conduction and heat spreading to a much larger surface area than the chip or a die pad it is mounted on.

Light emitting diodes (LEDs) have recently become popular alternatives to incandescent, fluorescent and halogen light sources. LEDs provide energy efficient, cost effective, long term lighting for medical, military, signage, signal, aircraft, maritime, automotive, portable, commercial and residential applications. For instance, LEDs provide light sources for lamps, flashlights, headlights, flood lights, traffic lights and displays.

LEDs include high power chips that generate high light output and considerable heat. Unfortunately, LEDs exhibit color shifts and low light output as well as short lifetimes and immediate failure at high operating temperatures. Furthermore, LED light output and reliability are constrained by heat dissipation limits. LEDs underscore the critical need for providing high power chips with adequate heat dissipation.

LED packages usually include an LED chip, a submount, electrical contacts and a thermal contact. The submount is thermally connected to and mechanically supports the LED chip. The electrical contacts are electrically connected to the anode and cathode of the LED chip. The thermal contact is thermally connected to the LED chip by the submount but requires adequate heat dissipation by the underlying carrier to prevent the LED chip from overheating.

Packages and thermal boards for high power chips have been developed extensively in the industry with a wide variety of designs and manufacturing techniques in attempts to meet performance demands in an extremely cost-competitive environment.

Plastic ball grid array (PBGA) packages have a chip and a laminated substrate enclosed in a plastic housing and are attached to a printed circuit board (PCB) by solder balls. The laminated substrate includes a dielectric layer that often includes fiberglass. The heat from the chip flows through the plastic and the dielectric layer to the solder balls and then the PCB. However, since the plastic and the dielectric layer typically have low thermal conductivity, the PBGA provides poor heat dissipation.

Quad-Flat-No Lead (QFN) packages have the chip mounted on a copper die pad which is soldered to the PCB. The heat from the chip flows through the die pad to the PCB. However, since the lead frame type interposer has limited routing capability, the QFN package cannot accommodate high input/output (I/O) chips or passive elements.

Thermal boards provide electrical routing, thermal management and mechanical support for semiconductor devices. Thermal boards usually include a substrate for signal routing, a heat spreader or heat sink for heat removal, pads for electrical connection to the semiconductor device and terminals for electrical connection to the next level assembly. The substrate can be a laminated structure with single layer or multi-layer routing circuitry and one or more dielectric layers. The heat spreader can be a metal base, a metal slug or an embedded metal layer.

Thermal boards interface with the next level assembly. For instance, the next level assembly can be a light fixture with a printed circuit board and a heat sink. In this instance, an LED package is mounted on the thermal board, the thermal board is mounted on the heat sink, the thermal board/heat sink subassembly and the printed circuit board are mounted in the light fixture and the thermal board is electrically connected to the printed circuit board by wires. The substrate routes electrical signals to the LED package from the printed circuit board and the heat spreader spreads and transfers heat from the LED package to the heat sink. The thermal board thus provides a critical thermal path for the LED chip.

U.S. Pat. No. 6,507,102 to Juskey et al. discloses an assembly in which a composite substrate with fiberglass and cured thermosetting resin includes a central opening, a heat slug with a square or rectangular shape resembling the central opening is attached to the substrate at sidewalls of the central opening, top and bottom conductive layers are attached to the top and bottom of the substrate and electrically connected to one another by plated through-holes through the substrate, a chip is mounted on the heat slug and wire bonded to the top conductive layer, an encapsulant is molded on the chip and solder balls are placed on the bottom conductive layer.

During manufacture, the substrate is initially a prepreg with B-stage resin placed on the bottom conductive layer, the heat slug is inserted into the central opening and on the bottom conductive layer and spaced from the substrate by a gap, the top conductive layer is mounted on the substrate, the conductive layers are heated and pressed towards one another so that the resin melts, flows into the gap and solidifies, the conductive layers are patterned to form circuit traces on the substrate and expose the excess resin flash on the heat slug, and the excess resin flash is removed to expose the heat slug. The chip is then mounted on the heat slug, wire bonded and encapsulated.

The heat flows from the chip through the heat slug to the PCB. However, manually dropping the heat slug into the central opening is prohibitively cumbersome and expensive for high volume manufacture. Furthermore, since the heat slug is difficult to accurately position in the central opening due to tight lateral placement tolerance, voids and inconsistent bond lines arise between the substrate and the heat slug. The substrate is therefore partially attached to the heat slug, fragile due to inadequate support by the heat slug and prone to delamination. In addition, the wet chemical etch that removes portions of the conductive layers to expose the excess resin flash also removes portions of the heat slug exposed by the excess resin flash. The heat slug is therefore non-planar and difficult to bond to. As a result, the assembly suffers from high yield loss, poor reliability and excessive cost.

U.S. Pat. No. 6,528,882 to Ding et al. discloses a thermal enhanced ball grid array package in which the substrate includes a metal core layer. The chip is mounted on a die pad region at the top surface of the metal core layer, an insulating layer is formed on the bottom surface of the metal core layer, blind vias extend through the insulating layer to the metal core layer, thermal balls fill the blind vias and solder balls are placed on the substrate and aligned with the thermal balls. The heat from the chip flows through the metal core layer to the thermal balls to the PCB. However, the insulating layer sandwiched between the metal core layer and the PCB limits the heat flow to the PCB.

U.S. Pat. No. 6,670,219 to Lee et al. discloses a cavity down ball grid array (CDBGA) package in which a ground plate with a central opening is mounted on a heat spreader to form a thermal dissipating substrate. A substrate with a central opening is mounted on the ground plate using an adhesive with a central opening. A chip is mounted on the heat spreader in a cavity defined by the central opening in the ground plate and solder balls are placed on the substrate. However, since the solder balls extend above the substrate, the heat spreader does not contact the PCB. As a result, the heat spreader releases the heat by thermal convection rather than thermal conduction which severely limits the heat dissipation.

U.S. Pat. No. 7,038,311 to Woodall et al. discloses a thermal enhanced BGA package in which a heat sink with an inverted T-like shape includes a pedestal and an expanded base, a substrate with a window opening is mounted on the expanded base, an adhesive attaches the pedestal and the expanded base to the substrate, a chip is mounted on the pedestal and wire bonded to the substrate, an encapsulant is molded on the chip and solder balls are placed on the substrate. The pedestal extends through the window opening, the substrate is supported by the expanded base and the solder balls are located between the expanded base and the perimeter of the substrate. The heat from the chip flows through the pedestal to the expanded base to the PCB. However, since the expanded base must leave room for the solder balls, the expanded base protrudes below the substrate only between the central window and the innermost solder ball. Consequently, the substrate is unbalanced and wobbles and warps during manufacture. This creates enormous difficulties with chip mounting, wire bonding and encapsulant molding. Furthermore, the expanded base may be bent by the encapsulant molding and may impede soldering the package to the next level assembly as the solder balls collapse. As a result, the package suffers from high yield loss, poor reliability and excessive cost.

U.S. Patent Application Publication No. 2007/0267642 to Erchak et al. discloses a light emitting device assembly in which a base with an inverted T-like shape includes a substrate, a protrusion and an insulative layer with an aperture, electrical contacts are mounted on the insulative layer, a package with an aperture and a transparent lid is mounted on the electrical contacts and an LED chip is mounted on the protrusion and wire bonded to the substrate. The protrusion is adjacent to the substrate and extends through the apertures in the insulative layer and the package into the package, the insulative layer is mounted on the substrate, the electrical contacts are mounted on the insulative layer and the package is mounted on the electrical contacts and spaced from the insulative layer. The heat from the chip flows through the protrusion to the substrate to a heat sink. However, the electrical contacts are difficult to mount on the insulating layer, difficult to electrically connect to the next level assembly and fail to provide multi-layer routing.

Conventional packages and thermal boards thus have major deficiencies. For instance, dielectrics with low thermal conductivity such as epoxy limit heat dissipation, whereas dielectrics with higher thermal conductivity such as epoxy filled with ceramic or silicon carbide have low adhesion and are prohibitively expensive for high volume manufacture. The dielectric may delaminate during manufacture or prematurely during operation due to the heat. The substrate may have single layer circuitry with limited routing capability or multi-layer circuitry with thick dielectric layers which reduce heat dissipation. The heat spreader may be inefficient, cumbersome or difficult to thermally connect to the next level assembly. The manufacturing process may be unsuitable for low cost, high volume manufacture.

In view of the various development stages and limitations in currently available packages and thermal boards for high power semiconductor devices, there is a need for a semiconductor chip assembly that is cost effective, reliable, manufacturable, versatile, provides flexible signal routing and has excellent heat spreading and dissipation.

SUMMARY OF THE INVENTION

The present invention provides a semiconductor chip assembly that includes a semiconductor device, a heat spreader, a conductive trace and an adhesive. The semiconductor device is electrically connected to the conductive trace and thermally connected to the heat spreader. The heat spreader includes a thermal post and a base. The thermal post extends upwardly from the base into a first opening in the adhesive, and the base extends laterally from the thermal post. The conductive trace includes a pad, a terminal and a signal post. The signal post extends upwardly from the terminal into a second opening in the adhesive. The adhesive extends above the base and between the base and the terminal.

In accordance with an aspect of the present invention, a semiconductor chip assembly includes a semiconductor device, an adhesive, a heat spreader and a conductive trace. The adhesive includes first and second openings. The heat spreader includes a thermal post and a base, wherein the thermal post is adjacent to the base and extends above the base in an upward direction, and the base extends below the thermal post in a downward direction opposite the upward direction and extends laterally from the thermal post in lateral directions orthogonal to the upward and downward directions. The conductive trace includes a pad, a terminal and a signal post, wherein the signal post extends below the pad and above the terminal and an electrically conductive path between the pad and the terminal includes the signal post.

The semiconductor device overlaps the thermal post, is electrically connected to the pad and thereby electrically connected to the terminal, and is thermally connected to the thermal post and thereby thermally connected to the base. The adhesive is mounted on and extends above the base and the terminal, extends laterally from the thermal post to or beyond the terminal and extends laterally between the base and the terminal. The pad extends above the signal post and the terminal extends below the signal post. The thermal post extends into the first opening and the signal post extends into the second opening. Furthermore, the posts have the same thickness and are coplanar with one another, and the base and the terminal have the same thickness and are coplanar with one another.

The signal post can be adjacent to the pad and the terminal and extend below the pad and above the terminal. The pad can overlap the adhesive, the terminal can be overlapped by the adhesive, and the signal post can extend through the adhesive. The pad, the terminal and the signal post can contact the adhesive, and an electrically conductive path between the pad and the terminal can be the signal post.

In accordance with another aspect of the present invention, a semiconductor chip assembly includes a semiconductor device, an adhesive, a heat spreader, a substrate and a conductive trace. The adhesive includes first and second openings. The heat spreader includes a thermal post and a base, wherein the thermal post is adjacent to the base and extends above the base in an upward direction, and the base extends below the thermal post in a downward direction opposite the upward direction and extends laterally from the thermal post in lateral directions orthogonal to the upward and downward directions. The substrate includes a dielectric layer, and first and second apertures extend through the substrate. The conductive trace includes the pad, a terminal and a signal post, wherein the signal post is adjacent to the pad and the terminal and extends below the pad and above the terminal, and an electrically conductive path between the pad and the terminal includes the signal post.

The semiconductor device is mounted on the heat spreader, overlaps the thermal post, is electrically connected to the pad and thereby electrically connected to the terminal, and is thermally connected to the thermal post and thereby thermally connected to the base. The adhesive is mounted on and extends above the base and the terminal, extends between the thermal post and the substrate, extends between the signal post and the substrate, extends laterally from the thermal post to or beyond the terminal, extends laterally between the base and the terminal below and outside peripheries of the posts and is sandwiched between the thermal post and the dielectric layer, between the signal post and the dielectric layer, between the base and the dielectric layer, between the terminal and the dielectric layer and between the base and the terminal. The substrate is mounted on the adhesive and extends above the base and the terminal. The pad extends above the adhesive, the dielectric layer and the signal post and the terminal extends below the dielectric layer and the signal post. The thermal post extends into the first opening and the first aperture, and the signal post extends into the second opening and the second aperture. Furthermore, the posts have the same thickness and are coplanar with one another, and the base and the terminal have the same thickness and are coplanar with one another.

The heat spreader can include a cap that extends above and is adjacent to and covers in the upward direction and extends laterally in the lateral directions from a top of the thermal post. For instance, the cap can have a rectangular or square shape and the top of the thermal post can have a circular shape. In this instance, the cap can be sized and shaped to accommodate a thermal contact surface of the semiconductor device whereas the top of the thermal post is not sized and shaped to accommodate the thermal contact surface of the semiconductor device. The cap can also contact and cover a portion of the adhesive that is coplanar with and adjacent to the thermal post. The cap can also be coplanar with the pad above the adhesive and the dielectric layer. In addition, the thermal post can thermally connect the base and the cap. The heat spreader can consist of the thermal post and the base or the thermal post, the base and the cap. The heat spreader can also consist of copper, aluminum or copper/nickel/aluminum. In any case, the heat spreader provides heat dissipation and spreading from the semiconductor device to the next level assembly.

The semiconductor device can be mounted on the heat spreader. For instance, the semiconductor device can be mounted on the heat spreader and the substrate, overlap the thermal post and the pad, be electrically connected to the pad using a first solder joint and be thermally connected to the heat spreader using a second solder joint. Alternatively, the semiconductor device can be mounted on the heat spreader but not the substrate, overlap the thermal post but not the substrate, be electrically connected to the pad using a wire bond and be thermally connected to the heat spreader using a die attach.

The semiconductor device can be a packaged or unpackaged semiconductor chip. For instance, the semiconductor device can be an LED package that includes an LED chip, is mounted on the heat spreader and the substrate, overlaps the thermal post and the pad, is electrically connected to the pad using a first solder joint and is thermally connected to the heat spreader using a second solder joint. Alternatively, the semiconductor device can be a semiconductor chip that is mounted on the heat spreader but not the substrate, overlaps the thermal post but not the substrate, is electrically connected to the pad using a wire bond and is thermally connected to the heat spreader using a die attach.

The adhesive can contact the thermal post, the signal post, the base, the terminal and the dielectric layer. For instance, the adhesive can contact the thermal post and the dielectric layer in a first gap in the first aperture between the thermal post and the substrate, contact the signal post and the dielectric layer in a second gap in the second aperture between the signal post and the substrate, extends across the dielectric layer in the gaps and contact the base, the terminal and the dielectric layer outside the gaps. The adhesive can also laterally surround the posts and the base without laterally surrounding the terminal. The adhesive can also conformally coat sidewalls of the posts and tops of the base and the terminal. The adhesive can also be coplanar with tops of the posts above the dielectric layer and essentially (nearly or entirely) coplanar with the base and the terminal below the posts and outside peripheries of the posts, the base and the terminal.

The adhesive can extend laterally from the thermal post to or beyond the terminal. For instance, the adhesive and the terminal can extend to peripheral edges of the assembly. In this instance, the adhesive extends laterally from the thermal post to the terminal. Alternatively, the adhesive can extend to peripheral edges of the assembly and the terminal can be spaced from the peripheral edges of the assembly. In this instance, the adhesive extends laterally from the thermal post beyond the terminal.

The thermal post can be integral with the base. For instance, the thermal post and the base can be a single-piece metal or include a single-piece metal at their interface, and the single-piece metal can be copper. The thermal post can also extend through the first aperture. The thermal post can also be coplanar with the adhesive above the dielectric layer. The thermal post can also have a cut-off conical shape in which its diameter decreases as it extends upwardly from the base to its flat top adjacent to the cap.

The signal post can be integral with the terminal. For instance, the signal post and the terminal can be a single-piece metal or include a single-piece metal at their interface, and the single-piece metal can be copper. The signal post can also extend through the second aperture. The signal post can also be coplanar with the adhesive above the dielectric layer. The signal post can also have a cut-off conical shape in which its diameter decreases as it extends upwardly from the terminal to its flat top adjacent to the pad.

The base can cover the thermal post in the downward direction, support the substrate and be spaced from peripheral edges of the assembly.

The substrate can be spaced from the posts, the terminal and the base. The substrate can also be a laminated structure.

The conductive trace can be spaced from the heat spreader. The pad can contact the adhesive and the dielectric layer, the terminal can contact the adhesive and be spaced from the dielectric layer and the signal post can contact the adhesive and be spaced from the dielectric layer. Furthermore, the terminal can be adjacent to and extend below and laterally from the signal post.

The pad can be an electrical contact for the semiconductor device, the terminal can be an electrical contact for the next level assembly, and the pad and the terminal can provide vertical signal routing between the semiconductor device and the next level assembly.

The assembly can be a first-level or second-level single-chip or multi-chip device. For instance, the assembly can be a first-level package that contains a single chip or multiple chips. Alternatively, the assembly can be a second-level module that contains a single LED package or multiple LED packages, and each LED package can contain a single LED chip or multiple LED chips.

The present invention provides a method of making a semiconductor chip assembly that includes providing a thermal post, a signal post, a base and a terminal, mounting an adhesive on the base including inserting the thermal post into a first opening in the adhesive and the signal post into a second opening in the adhesive, mounting a conductive layer on the adhesive including aligning the thermal post with a first aperture in the conductive layer and the signal post with a second aperture in the conductive layer, then flowing the adhesive upward between the thermal post and the conductive layer and between the signal post and the conductive layer and downward between the base and the terminal, solidifying the adhesive, providing a conductive trace that includes a pad, the terminal and the signal post, wherein the pad includes a selected portion of the conductive layer, mounting a semiconductor device on a heat spreader that includes the thermal post and the base, electrically connecting the semiconductor device to the conductive trace and thermally connecting the semiconductor device to the heat spreader.

In accordance with an aspect of the present invention, a method of making a semiconductor chip assembly includes (1) providing a thermal post, a signal post, a base, a terminal, an adhesive and a conductive layer, wherein (a) the thermal post is adjacent to the base, extends above the base in an upward direction, extends into a first opening in the adhesive and is aligned with a first aperture in the conductive layer, (b) the signal post is adjacent to the terminal, base, extends above the terminal in the upward direction, extends into a second opening in the adhesive and is aligned with a second aperture in the conductive layer, (c) the base extends below the thermal post in a downward direction opposite the upward direction and extends laterally from the thermal post in lateral directions orthogonal to the upward and downward directions, (d) the terminal extends below the signal post in the downward direction and extends laterally from the signal post in the lateral directions, (e) the adhesive is mounted on and extends above the base and the terminal, is sandwiched between the base and the conductive layer and between the terminal and the conductive layer and is non-solidified, and (f) the conductive layer is mounted on and extends above the adhesive, then (2) flowing the adhesive into and upward in a first gap located in the first aperture between the thermal post and the conductive layer and in a second gap located in the second aperture between the signal post and the conductive layer, (3) flowing the adhesive into and downward in a slot between the base and the terminal, (4) solidifying the adhesive, (5) providing a conductive trace that includes a pad, the terminal and the signal post, wherein the pad includes and a selected portion of the conductive layer, (6) mounting a semiconductor device on a heat spreader that includes the thermal post and the base, wherein the semiconductor device overlaps the thermal post, (7) electrically connecting the semiconductor device to the pad, thereby electrically connecting the semiconductor device to the terminal, wherein an electrically conductive path between the pad and the terminal includes the signal post, and (8) thermally connecting the semiconductor device to the thermal post, thereby thermally connecting the semiconductor device to the base.

In accordance with another aspect of the present invention, a method of making a semiconductor chip assembly includes (1) providing a metal plate that includes a thermal post, a signal post, a base and a terminal, wherein the thermal post is adjacent to and integral with the base and extends above the base in an upward direction, the signal post is adjacent to and integral with the terminal and extends above the terminal in the upward direction, the base extends below the thermal post in a downward direction opposite the upward direction and extends laterally from the thermal post in lateral directions orthogonal to the upward and downward directions, the terminal extends below the signal post in the downward direction and extends laterally from the signal post in the lateral directions and a slot extends through the metal plate between the base and the terminal, thereby providing edges of the base and the terminal that face towards one another, (2) providing an adhesive, wherein first and second openings extend through the adhesive, (3) providing a conductive layer, wherein first and second apertures extend through the conductive layer, (4) mounting the adhesive on the base and the terminal, including inserting the thermal post into the first opening and the signal post into the second opening, wherein the adhesive extends above the base and the terminal, the thermal post extends into the first opening and the signal post extends into the second opening, (5) mounting the conductive layer on the adhesive, including aligning the thermal post with the first aperture and the signal post with the second aperture, wherein the conductive layer extends above the adhesive and the adhesive is sandwiched between the base and the conductive layer and between the terminal and the conductive layer and is non-solidified, then (6) applying heat to melt the adhesive, (7) moving the base and the conductive layer towards one another, thereby moving the thermal post upward in the first aperture, moving the signal post upward in the second aperture and applying pressure to the molten adhesive between the base and the conductive layer and between the terminal and the conductive layer, wherein the pressure forces the molten adhesive to flow into and upward in a first gap located in the first aperture between the thermal post and the conductive layer and in a second gap located in the second aperture between the signal post and the conductive layer, and the pressure forces the molten adhesive to flow into and downward in the slot between the base and the terminal, (8) applying heat to solidify the molten adhesive, thereby mechanically attaching the posts, the base and the terminal to the conductive layer, then (9) providing a conductive trace that includes a pad, the terminal and the signal post, wherein the pad includes a selected portion of the conductive layer and an electrically conductive path between the pad and the terminal includes the signal post, (10) removing selected portions of the metal plate, thereby providing additional edges of the base and the terminal, then (11) mounting a semiconductor device on a heat spreader that includes the thermal post and the base, wherein the semiconductor device overlaps the thermal post, (12) electrically connecting the semiconductor device to the pad, thereby electrically connecting the semiconductor device to the terminal, and (13) thermally connecting the semiconductor device to the thermal post, thereby thermally connecting the semiconductor device to the base.

Mounting the conductive layer can include mounting the conductive layer alone on the adhesive, or alternatively, attaching the conductive layer to a carrier, then mounting the conductive layer and the carrier on the adhesive such that the carrier overlaps the conductive layer and the conductive layer contacts the adhesive and is sandwiched between the adhesive and the carrier, and then, after solidifying the adhesive, removing the carrier and then providing the conductive trace.

In accordance with another aspect of the present invention, a method of making a semiconductor chip assembly includes (1) providing a thermal post, a signal post, a base, a terminal, an adhesive and a substrate, wherein the (a) thermal post is adjacent to the base, extends above the base in an upward direction, extends through a first opening in the adhesive and extends into a first aperture in the substrate, (b) the signal post is adjacent to the terminal, extends above the terminal in the upward direction, extends through a second opening in the adhesive and extends into a second aperture in the substrate, (c) the base extends below the thermal post in a downward direction opposite the upward direction and extends laterally from the thermal post in lateral directions orthogonal to the upward and downward directions, (d) the terminal extends below the signal post in the downward direction and extends laterally from the signal post in the lateral directions, (e) the adhesive is mounted on and extends above the base and the terminal, is sandwiched between the base and the substrate and between the terminal and the substrate and is non-solidified, (f) the substrate is mounted on and extends above the adhesive, wherein the substrate includes a conductive layer and a dielectric layer and the conductive layer extends above the dielectric layer, then (2) flowing the adhesive into and upward in a first gap located in the first aperture between the thermal post and the substrate and in a second gap located in the second aperture between the signal post and the substrate, (3) flowing the adhesive into and downward in a slot between the base and the terminal, wherein the slot provides edges of the base and the terminal that face towards one another, (4) solidifying the adhesive, then (5) providing a conductive trace that includes a pad, the terminal and the signal post, wherein the pad extends above the signal post and includes a selected portion of the conductive layer, (6) providing additional edges of the base and the terminal, then (7) mounting a semiconductor device on a heat spreader that includes the thermal post and the base, wherein the semiconductor device overlaps the thermal post, (8) electrically connecting the semiconductor device to the pad, thereby electrically connecting the semiconductor device to the terminal, wherein an electrically conductive path between the pad and the terminal includes the signal post, and (9) thermally connecting the semiconductor device to the thermal post, thereby thermally connecting the semiconductor device to the base.

In accordance with another aspect of the present invention, a method of making a semiconductor chip assembly includes (1) providing a metal plate that includes a thermal post, a signal post, a base and a terminal, wherein the thermal post is adjacent to and integral with the base and extends above the base in an upward direction, the signal post is adjacent to and integral with the terminal and extends above the terminal in the upward direction, the base extends below the thermal post in a downward direction opposite the upward direction and extends laterally from the thermal post in lateral directions orthogonal to the upward and downward directions, the terminal extends below the signal post in the downward direction and extends laterally from the signal post in the lateral directions and a slot extends through the metal plate between the base and the terminal, thereby providing edges of the base and the terminal that face towards one another, (2) providing an adhesive, wherein first and second openings extend through the adhesive, (3) providing a substrate that includes a first conductive layer and a dielectric layer, wherein first and second apertures extend through the substrate, (4) mounting the adhesive on the base and the terminal, including inserting the thermal post through the first opening and the signal post through the second opening, wherein the adhesive extends above the base and the terminal, the thermal post extends through the first opening and the signal post extends through the second opening, (5) mounting the substrate on the adhesive, including inserting the thermal post into the first aperture and the signal post into the second aperture, wherein the substrate extends above the adhesive, the conductive layer extends above the dielectric layer, the thermal post extends through the first opening into the first aperture, the signal post extends through the second opening into the second aperture, and the adhesive is sandwiched between the base and the substrate and between the terminal and the substrate and is non-solidified, then (6) applying heat to melt the adhesive, (7) moving the base and the terminal towards and the substrate, thereby moving the thermal post upward in the first aperture, moving the signal post upward in the second aperture and applying pressure to the molten adhesive between the base and the substrate and between the base and the terminal, wherein the pressure forces the molten adhesive to flow into and upward in a first gap located in the first aperture between the thermal post and the substrate and in a second gap located in the second aperture between the signal post and the substrate, and the pressure forces the molten adhesive to flow into and downward in the slot between the base and the terminal, (8) applying heat to solidify the molten adhesive, thereby mechanically attaching the posts, the base and the terminal to the substrate, then (9) depositing a second conductive layer on the posts, the adhesive and the first conductive layer, then (10) providing a pad that includes a selected portion of the conductive layers, including removing selected portions of the conductive layers, wherein the pad is above and adjacent to and covers in the upward direction and extends laterally in the lateral directions from a top of the signal post and an electrically conductive path between the pad and the terminal includes the signal post, (11) providing a cap on the thermal post that includes a selected portion of the second conductive layer, including removing selected portions of the second conductive layer, wherein the cap is above and adjacent to and covers in the upward direction and extends laterally in the lateral directions from a top of the thermal post and a thermally conductive path between the cap and the base includes the thermal post, (12) removing selected portions of the metal plate, thereby providing additional edges of the base and the terminal, then (13) mounting a semiconductor device on the cap, wherein the semiconductor device overlaps the thermal post and a heat spreader includes the thermal post, the base and the cap, (14) electrically connecting the semiconductor device to the pad, thereby electrically connecting the semiconductor device to the terminal, and (15) thermally connecting the semiconductor device to the cap, thereby thermally connecting the semiconductor device to the base.

Providing the posts, the base and the terminal can include providing a metal plate, removing selected portions of the metal plate using a first etch mask that defines the posts, removing selected portions of the metal plate using a second etch mask that defines the slot, and removing the etch masks. The first etch mask can be formed on and selectively expose a first surface of the metal plate to define the posts, the second etch mask can be formed on and selectively expose a second surface of the metal plate opposite the first surface to define the slot, thereby defining the edges of the base and the terminal that face towards one another, and etching the metal plate in patterns defined by the etch masks can form a recess in the metal plate that extends from the first surface into but not through the metal plate and is adjacent to the posts and the slot in the metal plate that extends from the second surface through a recessed portion of the metal plate, is overlapped by the recess and is adjacent to the base and the terminal.

Providing the adhesive can include providing a prepreg with uncured epoxy, flowing the adhesive can include melting the uncured epoxy and compressing the uncured epoxy between the base and the substrate and between the terminal and the substrate, and solidifying the adhesive can include curing the molten uncured epoxy.

Providing the heat spreader can include providing a cap on the thermal post that extends above and is adjacent to and covers in the upward direction and extends laterally in the lateral directions from a top of the thermal post after solidifying the adhesive and before mounting the semiconductor device.

Providing the pad can include removing selected portions of the conductive layer after solidifying the adhesive.

Providing the pad can also include grinding the posts, the adhesive and the conductive layer after solidifying the adhesive such that the posts, the adhesive and the conductive layer are laterally aligned with one another at a top lateral surface that faces in the upward direction, and then removing selected portions of the conductive layer such that the pad includes a selected portion of the conductive layer. The grinding can include grinding the adhesive without grinding the posts and then grinding the posts, the adhesive and the conductive layer. The removing can include applying a wet chemical etch to the conductive layer using an etch mask that defines the pad.

Providing the pad can also include depositing a second conductive layer on the posts, the adhesive and the conductive layer after the grinding and then removing selected portions of the conductive layers such that the pad includes selected portions of the conductive layers. Depositing the second conductive layer can include electrolessly plating a first plated layer on the posts, the adhesive and the conductive layer and then electroplating a second plated layer on the first plated layer. The removing can include applying the wet chemical etch to the conductive layers using the etch mask to define the pad.

Providing the cap can include removing selected portions of the second conductive layer. Providing the cap can also include the grinding and then removing selected portions of the second conductive layer using the etch mask to define the cap such that the cap includes selected portions of the second conductive layer. The cap can also include selected portions of the conductive layer. Thus, the pad and the cap can be formed simultaneously using the same grinding, wet chemical etch and etch mask.

Providing the conductive trace and the heat spreader can include removing selected portions of the metal plate after solidifying the adhesive.

Providing the conductive trace and the heat spreader can also include grinding the base, the terminal and the adhesive after solidifying the adhesive such that the base, the terminal and the adhesive are laterally aligned with one another at a bottom lateral surface that faces in the downward direction, and then removing selected portions the metal plate, thereby providing additional edges of the base and the terminal. The grinding can include grinding the adhesive without grinding the base and the terminal and then grinding the base, the terminal and the adhesive. The removing can include cutting the metal plate at cut lines that define the additional edges of the base and the terminal, or alternatively, applying a wet chemical etch to the metal plate using an etch mask that defines the additional edges of the base and the terminal.

Providing the conductive trace and the heat spreader can also include depositing a third conductive layer on the base, the terminal and the adhesive after the grinding thereby covering the base, the terminal and the adhesive in the downward direction and then removing the third conductive layer thereby exposing the base, the terminal and the adhesive in the downward direction. Depositing the third conductive layer can include electrolessly plating a first plated layer on the base, the terminal and the adhesive and then electroplating a second plated layer on the first plated layer. The removing can include applying the wet chemical etch to the third conductive layer without using an etch mask.

Flowing the adhesive can include filling the gaps and the slot with the adhesive. Flowing the adhesive can also include squeezing the adhesive through the gaps, above the posts and the substrate and on top surface portions of the posts and the substrate adjacent to the gaps as well as squeezing the adhesive through the slot, below the base and the terminal and on bottom surface portions of the base and the terminal adjacent to the slot.

Solidifying the adhesive can include mechanically bonding the posts, the base and the terminal to the substrate.

Mounting the semiconductor device can include mounting the semiconductor device on the cap. Mounting the semiconductor device can also include positioning the semiconductor device above and overlapping the thermal post, the cap, the first opening and the first aperture without overlapping the signal post, the second opening or the second aperture.

Mounting the semiconductor device can include providing a first solder joint between an LED package that includes an LED chip and the pad and a second solder joint between the LED package and the cap, electrically connecting the semiconductor device can include providing the first solder joint between the LED package and the pad, and thermally connecting the semiconductor device can include providing the second solder joint between the LED package and the cap.

Mounting the semiconductor device can include providing a die attach between a semiconductor chip and the cap, electrically connecting the semiconductor device can include providing a wire bond between the chip and the pad, and thermally connecting the semiconductor device can include providing the die attach between the chip and the cap.

The adhesive can contact the posts, the base, the pad, the terminal, the cap and the dielectric layer, cover the substrate in the downward direction, cover and surround the posts and the base in the lateral directions and extend to peripheral edges of the assembly after the assembly is manufactured and detached from other assemblies in a batch.

The base can cover the semiconductor device, the thermal post and the cap in the downward direction, support the substrate and be spaced from peripheral edges of the assembly after the assembly is manufactured and detached from other assemblies in a batch.

The present invention has numerous advantages. The heat spreader can provide excellent heat spreading and heat dissipation without heat flow through the adhesive. As a result, the adhesive can be a low cost dielectric with low thermal conductivity and not prone to delamination. The thermal post and the base can be integral with one another and the signal post and the terminal can be integral with one another, thereby enhancing reliability. The cap can be customized for the semiconductor device, thereby enhancing the thermal connection. The adhesive can be sandwiched between the thermal post and the substrate and between the base and the substrate, thereby providing a robust mechanical bond between the heat spreader and the substrate. The adhesive can also be sandwiched between the signal post and the substrate and between the terminal and the substrate, thereby providing a robust mechanical bond between the conductive trace and the substrate. The conductive trace can provide signal routing with simple circuitry patterns or flexible multi-layer signal routing with complex circuitry patterns. The conductive trace can also provide vertical signal routing between the pad above the dielectric layer and the terminal below the dielectric layer. The base can provide mechanical support for the substrate, thereby preventing warping. The thermal board top surface can be almost entirely a highly reflective metal, thereby increasing light output from an LED chip mounted on the cap. The assembly need not contain a solder mask, thereby reducing cost. The assembly can be manufactured using low temperature processes which reduces stress and improves reliability. The assembly can also be manufactured using well-controlled processes which can be easily implemented by circuit board, lead frame and tape manufacturers.

These and other features and advantages of the present invention will be further described and more readily apparent from a review of the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE INVENTION

Figure 1A:
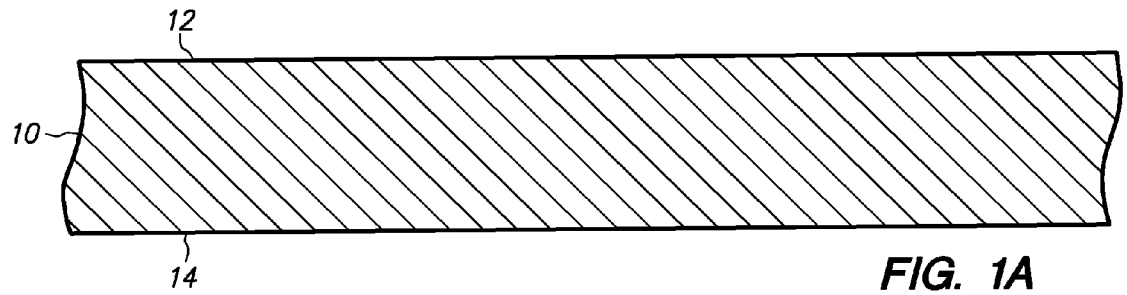
FIGS. 1A-1D are cross-sectional views showing a method of making a thermal post, a signal post, a base and a terminal in accordance with an embodiment of the present invention.
Figure 1B:
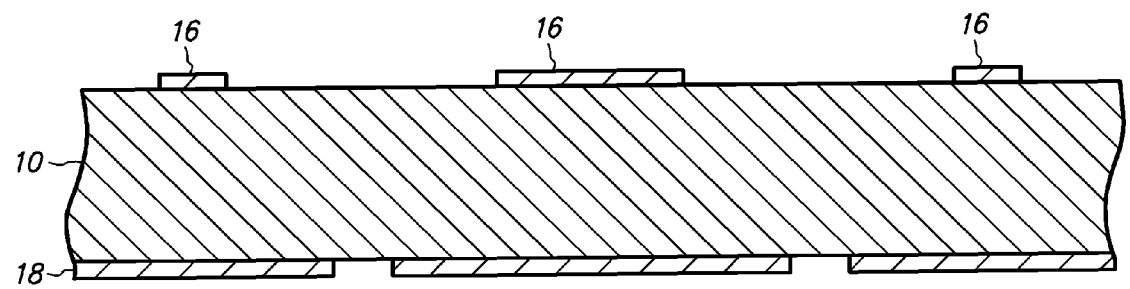
Figure 1C:
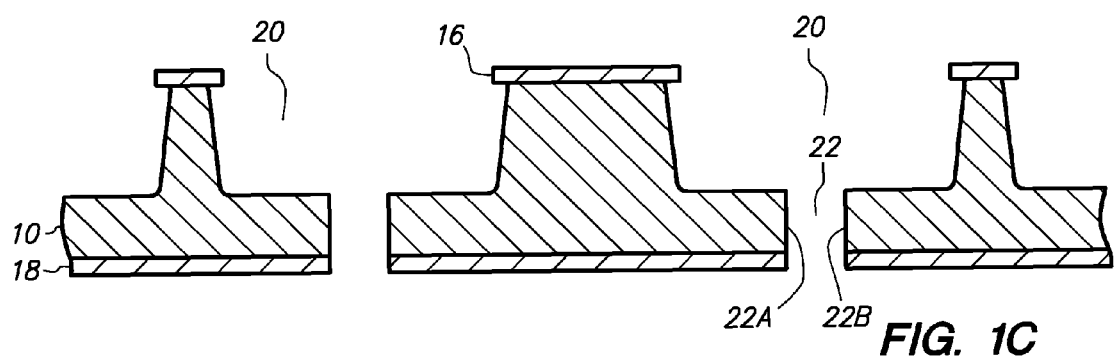
Figure 1D:
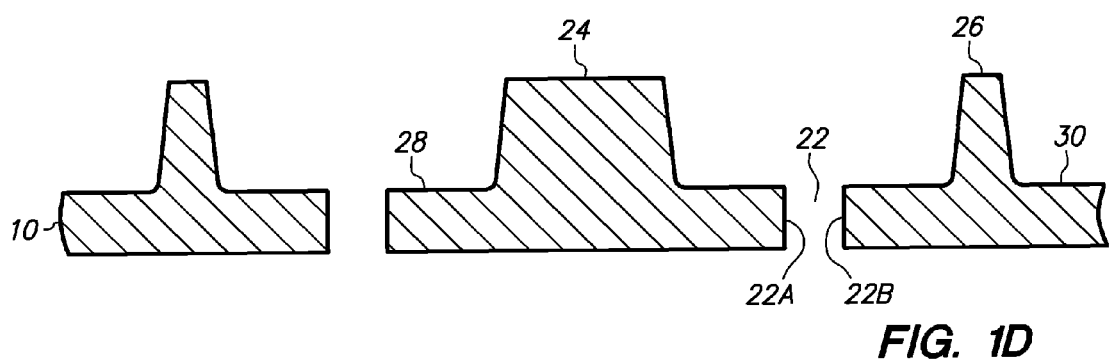
Figure 1E:
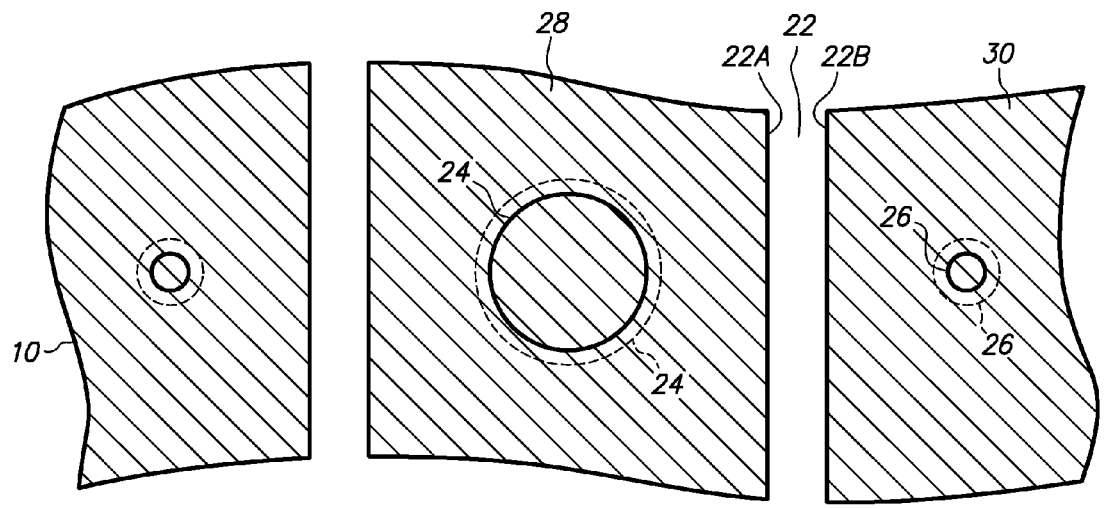
FIGS. 1E and 1F are top and bottom views, respectively, corresponding to FIG. 1D.
Figure 1F:
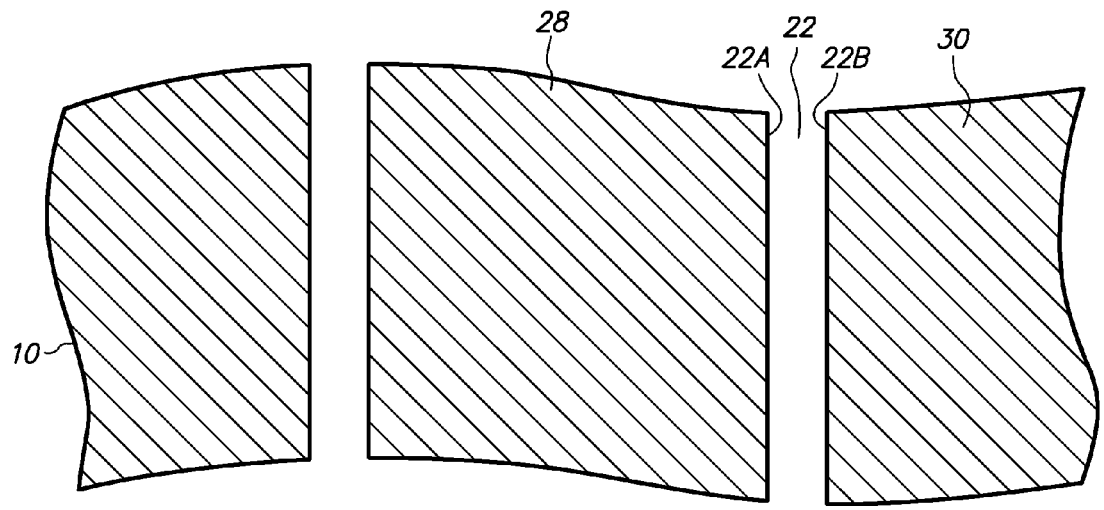

FIGS. 1A-1D are cross-sectional views showing a method of making a thermal post, a signal post, a base and a terminal in accordance with an embodiment of the present invention, and FIGS. 1E and 1F are top and bottom views, respectively, corresponding to FIG. 1D.

FIG. 1A. is a cross-sectional view of metal plate 10 which includes opposing major surfaces 12 and 14. Metal plate 10 is illustrated as a copper plate with a thickness of 400 microns. Copper has high thermal conductivity, good bondability and low cost. Metal plate 10 can be various metals such as copper, aluminum, alloy 42, iron, nickel, silver, gold, combinations thereof, and alloys thereof.

FIG. 1B is a cross-sectional view of etch masks 16 and 18 formed on metal plate 10. Etch masks 16 and 18 are illustrated as photoresist layers which are deposited on metal plate 10 using dry film lamination in which hot rolls simultaneously press photoresist layers 16 and 18 onto surfaces 12 and 14, respectively. Wet spin coating and curtain coating are also suitable deposition techniques. A first reticle (not shown) is positioned proximate to photoresist layer 16 and a second reticle (not shown) is positioned proximate to photoresist layer 18. Thereafter, photoresist layers 16 and 18 are patterned by selectively applying light through the first and second reticles, respectively, so that the photoresist portions exposed to the light are rendered insoluble, applying a developer solution to remove the photoresist portions that are unexposed to the light and remain soluble and then hard baking, as is conventional. As a result, photoresist layer 16 has a pattern that selectively exposes surface 12, and photoresist layer 18 has a pattern that selectively exposes surface 14.

FIG. 1C is a cross-sectional view of recess 20 formed into but not through metal plate 10 by etching metal plate 10 in the pattern defined by etch mask 16 and slot 22 formed through a recessed portion of metal plate 10 in the pattern defined by etch mask 18. The etching is illustrated as a front-side and back-side wet chemical etch. For instance, a top spray nozzle (not shown) and a bottom spray nozzle (not shown) can spray the wet chemical etch on the top and bottom of the structure, or the structure can be dipped in the wet chemical etch. The wet chemical etch is highly selective of copper and etches 250 microns into metal plate 10. As a result, recess 20 extends downwardly from surface 12 into but not through metal plate 10, is spaced from surface 14 by 150 microns (400-250) and has a depth of 250 microns. Furthermore, slot 22 extends upwardly from surface 14 through the recessed portion of metal plate 10, is overlapped by recess 20, defines opposing edges 22A and 22B that face towards one another and has a depth of 150 microns. The wet chemical etch also laterally undercuts metal plate 10 beneath etch mask 16. A suitable wet chemical etch can be provided by a solution containing alkaline ammonia or a dilute mixture of nitric and hydrochloric acid. Likewise, the wet chemical etch can be acidic or alkaline. The optimal etch time for forming recess 20 and slot 22 without excessively exposing metal plate 10 to the wet chemical etch can be established through trial and error.

FIGS. 1D, 1E and 1F are cross-sectional, top and bottom views, respectively, of metal plate 10 after etch masks 16 and 18 are removed. The photoresist layers are stripped using a solvent, such as a strong alkaline solution containing potassium hydroxide with a pH of 14, that is highly selective of photoresist with respect to copper.

Metal plate 10 as etched includes thermal post 24, signal post 26, base 28 and terminal 30.

Thermal post 24 is a first unetched portion of metal plate 10 defined by etch mask 16. Thermal post 24 is adjacent to and integral with and protrudes above base 28 and is laterally surrounded by recess 20. Thermal post 24 has a height of 250 microns (recess 20 depth), a diameter at its top surface (circular portion of surface 12) of 1000 microns and a diameter at its bottom (circular portion adjacent to base 28) of 1100 microns. Thus, thermal post 24 has a cut-off conical shape (resembling a frustum) with tapered sidewalls in which its diameter decreases as it extends upwardly from base 28 to its flat circular top surface. The tapered sidewalls arise from the lateral undercutting by the wet chemical etch beneath etch mask 16. The top surface is concentrically disposed within a periphery of the bottom (shown in phantom in FIG. 1E).

Signal post 26 is a second unetched portion of metal plate 10 defined by etch mask 16. Signal post 26 is adjacent to and integral with and protrudes above terminal 30 and is laterally surrounded by recess 20 and laterally spaced from thermal post 24. Signal post 26 has a height of 250 microns (recess 20 depth), a diameter at its top surface (circular portion of surface 12) of 300 microns and a diameter at its bottom (circular portion adjacent to terminal 30) of 400 microns. Thus, signal post 26 has a cut-off conical shape (resembling a frustum) with tapered sidewalls in which its diameter decreases as it extends upwardly from terminal 30 to its flat circular top surface. The tapered sidewalls arise from the lateral undercutting by the wet chemical etch beneath etch mask 16. The top surface is concentrically disposed within a periphery of the bottom (shown in phantom in FIG. 1E).

Base 28 is a third unetched portion of metal plate 10 that is below thermal post 22, covers thermal post 24 in the downward direction, extends laterally from thermal post 22 in a lateral plane (with lateral directions such as left and right), includes edge 22A and has a thickness of 150 microns (400-250).

Terminal 30 is a fourth unetched portion of metal plate 10 that is below signal post 26, covers thermal post 24 in the downward direction, extends laterally from signal post 26 in the lateral plane, includes edge 22B and has a thickness of 150 microns (400-250).

Thus, posts 24 and 26 have the same thickness and are coplanar with one another, and base 28 and terminal 30 have the same thickness and are coplanar with one another. Furthermore, base 28 and terminal 30 are adjacent to and separated by slot 22 which has a width of 300 microns.

Thermal post 24, signal post 26, base 28 and terminal 30 can be treated to improve bondability to epoxy and solder. For instance, posts 24 and 26, base 28 and terminal 30 can be chemically oxidized or microetched to provide rougher surfaces.

Thermal post 24, signal post 26, base 28 and terminal 30 are illustrated as a subtractively formed single-piece metal (copper). Thermal post 24 and signal post 26 can also formed by stamping metal plate 10 with a contact piece with a first recess or hole that defines thermal post 24 and a second recess or hole that defines signal post 26. Posts 24 and 26 can also be formed additively by depositing posts 24 and 26 on base 28 and terminal 30 using electroplating, chemical vapor deposition (CVD), physical vapor deposition (PVD) and so on, for instance by electroplating a solder thermal post 24 and a solder signal post 26 on a copper base 28 and a copper terminal 30, in which case thermal post 24 and base 28 have a metallurgical interface and are adjacent to but not integral with one another and signal post 26 and terminal 30 have a metallurgical interface and are adjacent to but not integral with one another. Posts 24 and 26 can also be formed semi-additively, for instance by depositing upper portions of posts 24 and 26 on etch-defined lower portions of posts 24 and 26. Posts 24 and 26 can also be formed semi-additively by depositing conformal upper portions of posts 24 and 26 on etch-defined lower portions of posts 24 and 26. Posts 24 and 26 can also be sintered to base 28 and terminal 30.

Figure 2A:
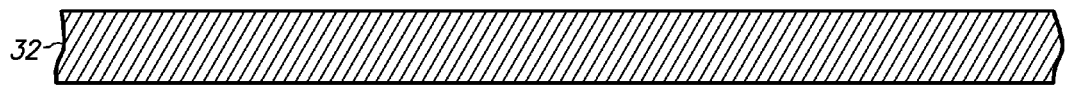
FIGS. 2A and 2B are cross-sectional views showing a method of making an adhesive in accordance with an embodiment of the present invention.
Figure 2B:
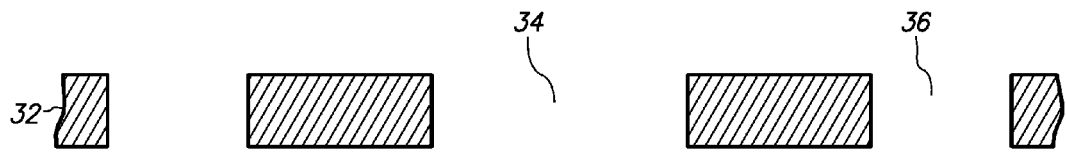
Figure 2C:
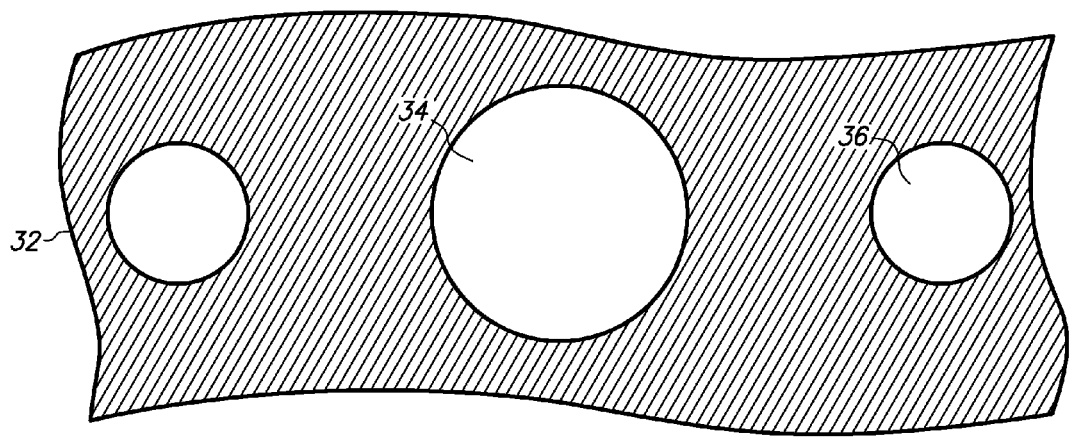
FIGS. 2C and 2D are top and bottom views, respectively, corresponding to FIG. 2B.
Figure 2D:
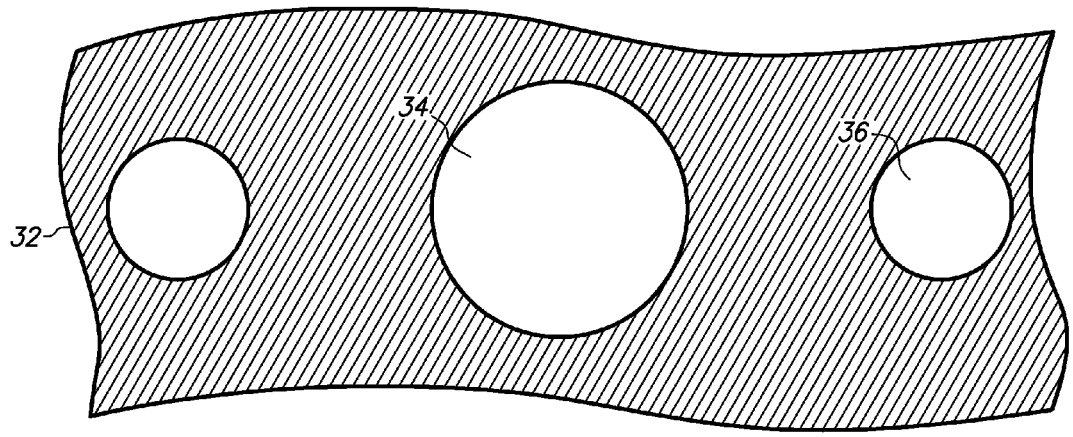

FIGS. 2A and 2B are cross-sectional views showing a method of making an adhesive in accordance with an embodiment of the present invention, and FIGS. 2C and 2D are top and bottom views, respectively, corresponding to FIG. 2B.

FIG. 2A is a cross-sectional view of adhesive 32. Adhesive 32 is illustrated as a prepreg with B-stage uncured epoxy provided as a non-solidified unpatterned sheet with a thickness of 150 microns.

Adhesive 32 can be various dielectric films or prepregs formed from numerous organic or inorganic electrical insulators. For instance, adhesive 32 can initially be a prepreg in which thermosetting epoxy in resin form impregnates a reinforcement and is partially cured to an intermediate stage. The epoxy can be FR-4 although other epoxies such as polyfunctional and bismaleimide triazine (BT) are suitable. For specific applications, cyanate esters, polyimide and PTFE are also suitable. The reinforcement can be E-glass although other reinforcements such as S-glass, D-glass, quartz, kevlar aramid and paper are suitable. The reinforcement can also be woven, non-woven or random microfiber. A filler such as silica (powdered fused quartz) can be added to the prepreg to improve thermal conductivity, thermal shock resistance and thermal expansion matching. Commercially available prepregs such as SPEEDBOARD C prepreg by W.L. Gore & Associates of Eau Claire, Wis. are suitable.

FIGS. 2B, 2C and 2D are cross-sectional, top and bottom views, respectively, of adhesive 32 with openings 34 and 36. Opening 34 is a first window that extends through adhesive 32 and has a diameter of 1150 microns, and opening 36 is a second window that extends through adhesive 32 and has a diameter of 450 microns. Openings 34 and 36 are formed by mechanical drilling through the prepreg and can be formed by other techniques such as punching and stamping.

Figure 3A:
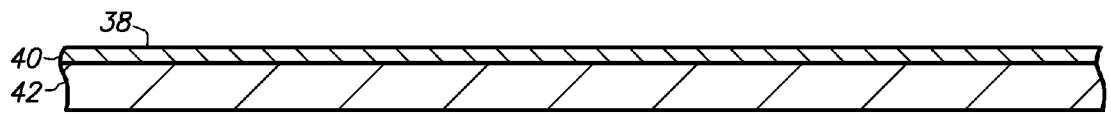
FIGS. 3A and 3B are cross-sectional views showing a method of making a substrate in accordance with an embodiment of the present invention.
Figure 3B:
Figure 3C:
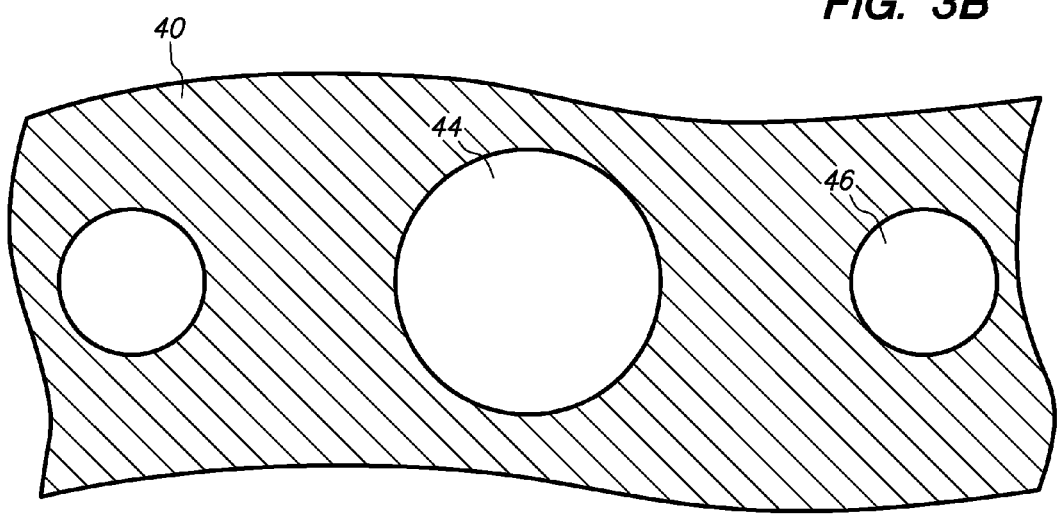
FIGS. 3C and 3D are top and bottom views, respectively, corresponding to FIG. 3B.
Figure 3D:
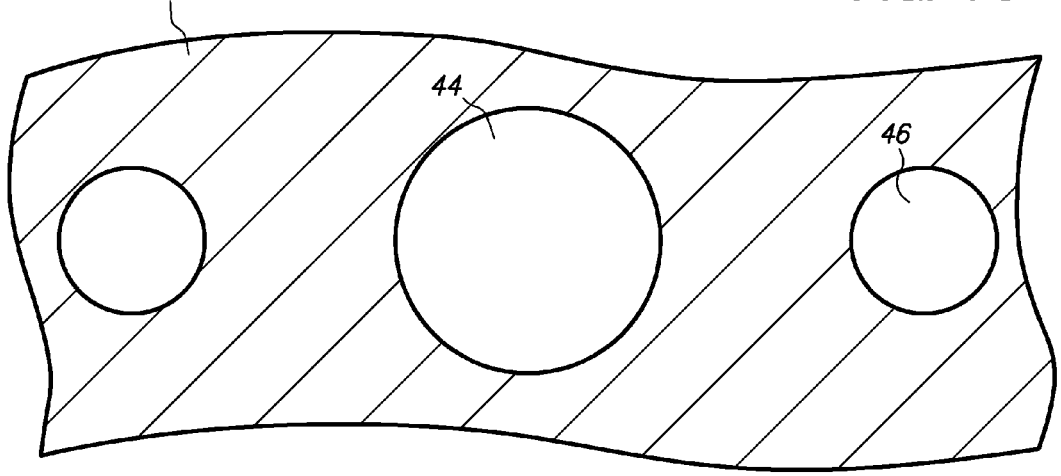

FIGS. 3A and 3B are cross-sectional views showing a method of making a substrate in accordance with an embodiment of the present invention, and FIGS. 3C and 3D are top and bottom views, respectively, corresponding to FIG. 3B.

FIG. 3A is a cross-sectional view of substrate 38 that includes conductive layer 40 and dielectric layer 42. Conductive layer 40 is an electrical conductor that contacts and extends above dielectric layer 42, and dielectric layer 42 is an electrical insulator. For instance, conductive layer 40 is an unpatterned copper sheet with a thickness of 30 microns, and dielectric layer 42 is epoxy with a thickness of 130 microns.

FIGS. 3B, 3C and 3D are cross-sectional, top and bottom views, respectively, of substrate 38 with apertures 44 and 46. Aperture 44 is a first window that extends through substrate 38 and has a diameter of 1150 microns, and aperture 46 is a second window that extends through substrate 38 and has a diameter of 450 microns. Apertures 44 and 46 are formed by mechanical drilling through conductive layer 40 and dielectric layer 42 and can be formed with other techniques such as punching and stamping. Preferably, opening 34 and aperture 44 have the same diameter and are formed in the same manner with the same drill bit at the same drilling station, and opening 36 and aperture 46 have the same diameter and are formed in the same manner with the same drill bit at the same drilling station.

Substrate 38 is illustrated as a laminated structure. Substrate 38 can be other electrical interconnects such as a ceramic board or a printed circuit board. Likewise, substrate 38 can include additional layers of embedded circuitry.

Figure 4A:
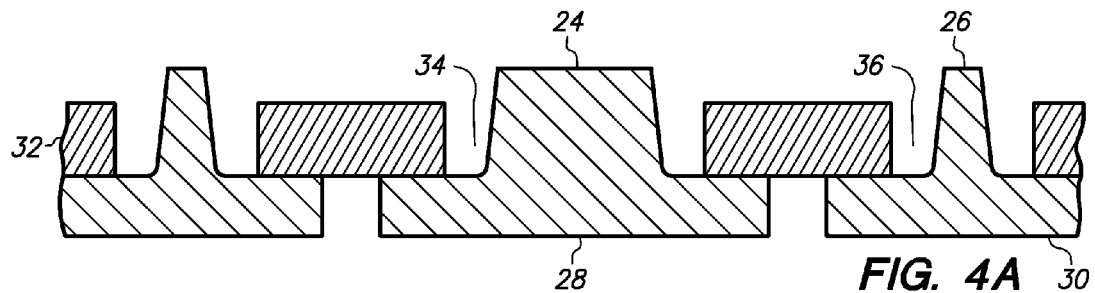
FIGS. 4A-4K are cross-sectional views showing a method of making a thermal board with a substrate on an adhesive in accordance with an embodiment of the present invention.
Figure 4B:
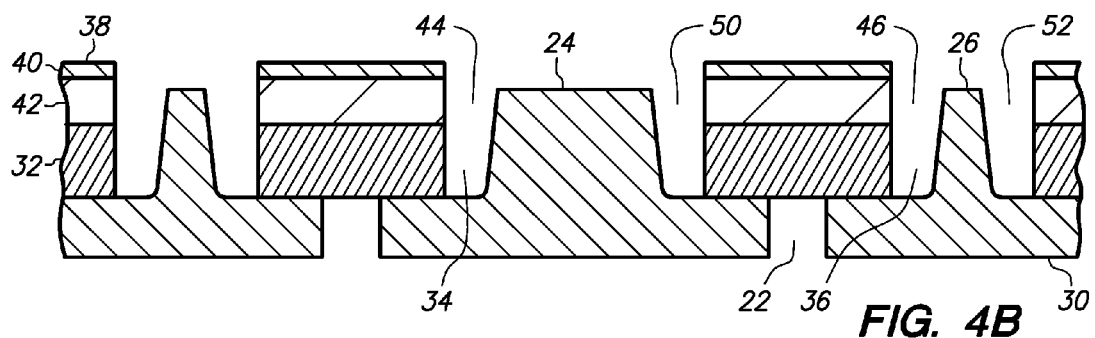
Figure 4C:
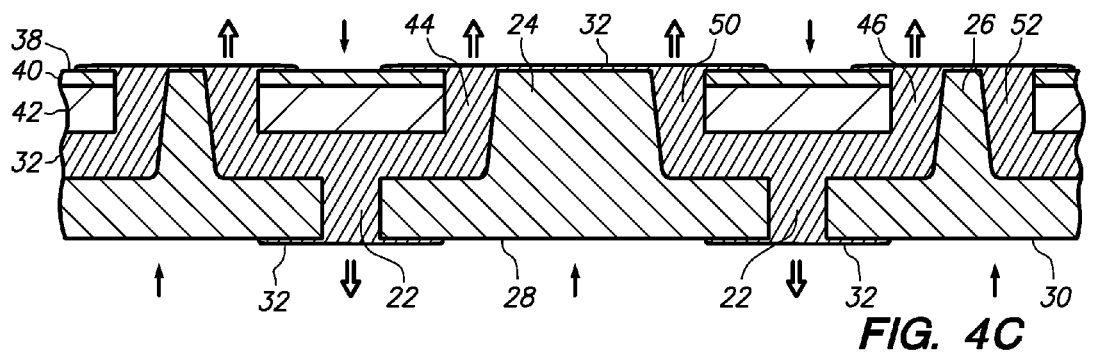
Figure 4D:
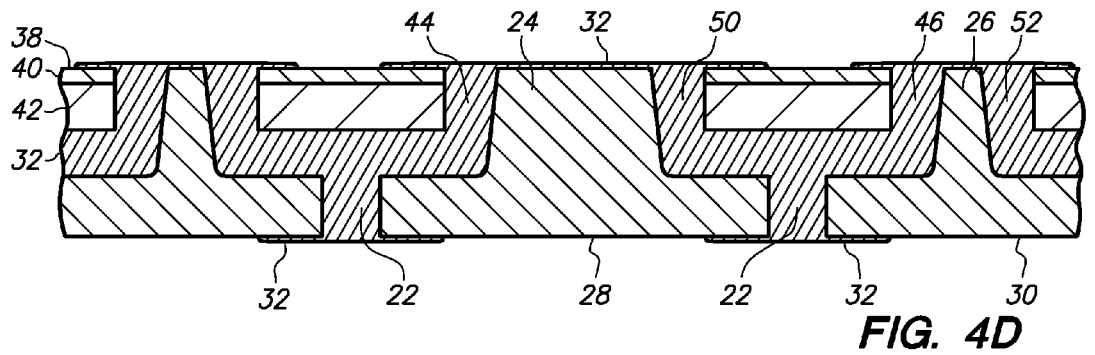
Figure 4E:
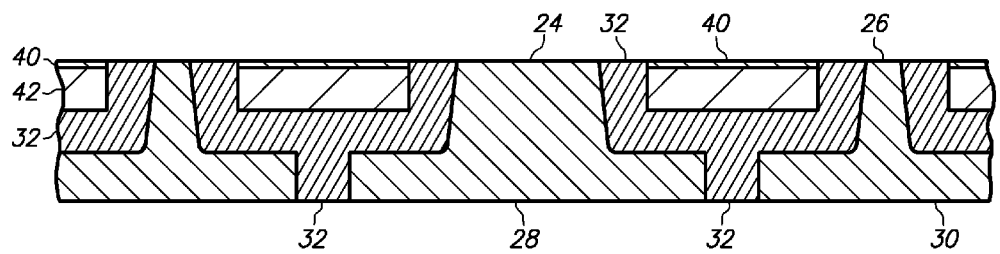
Figure 4F:
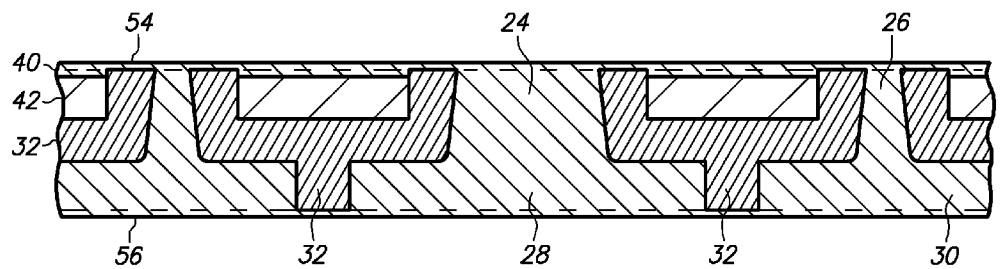
Figure 4G:
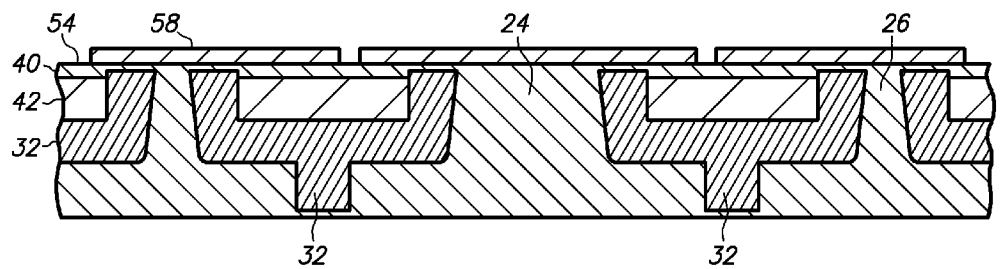
Figure 4H:
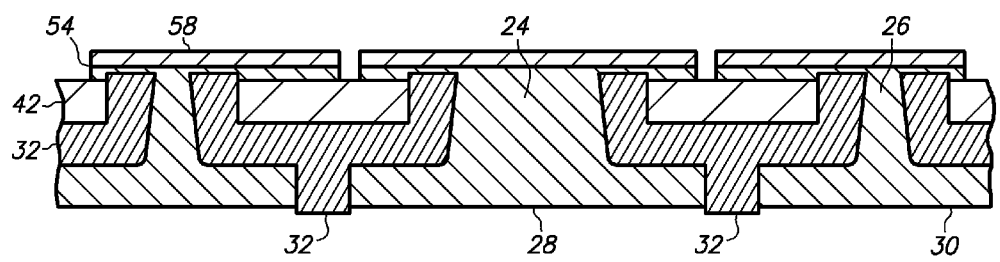
Figure 4I:
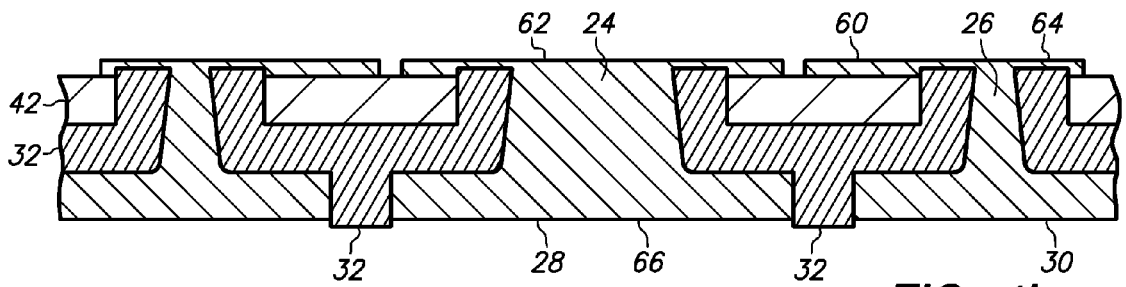
Figure 4J:
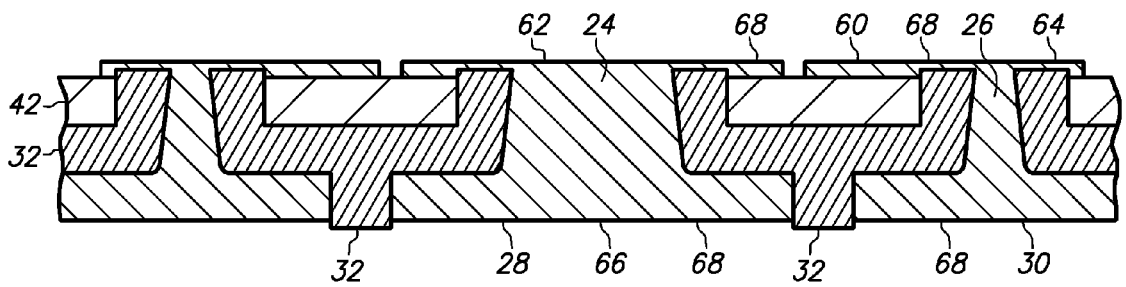
Figure 4K:
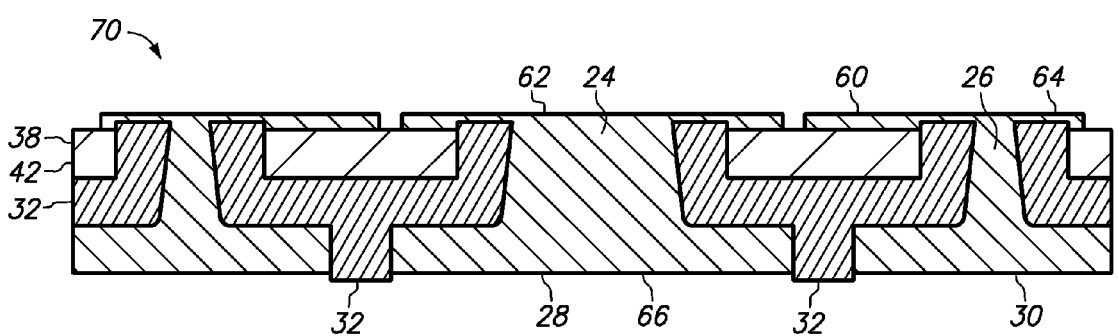
Figure 4L:
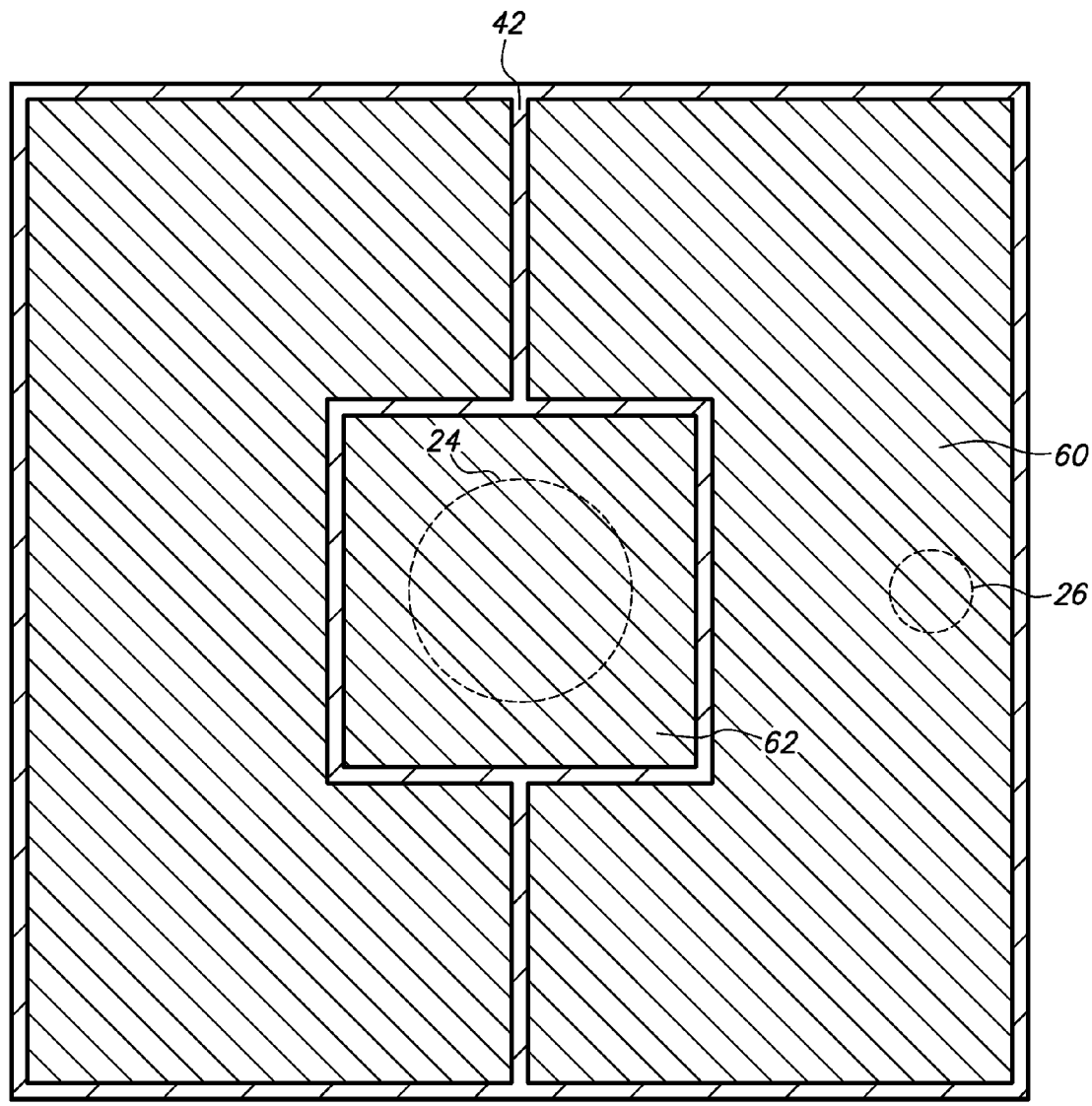
FIGS. 4L and 4M are top and bottom views, respectively, corresponding to FIG. 4K.
Figure 4M:
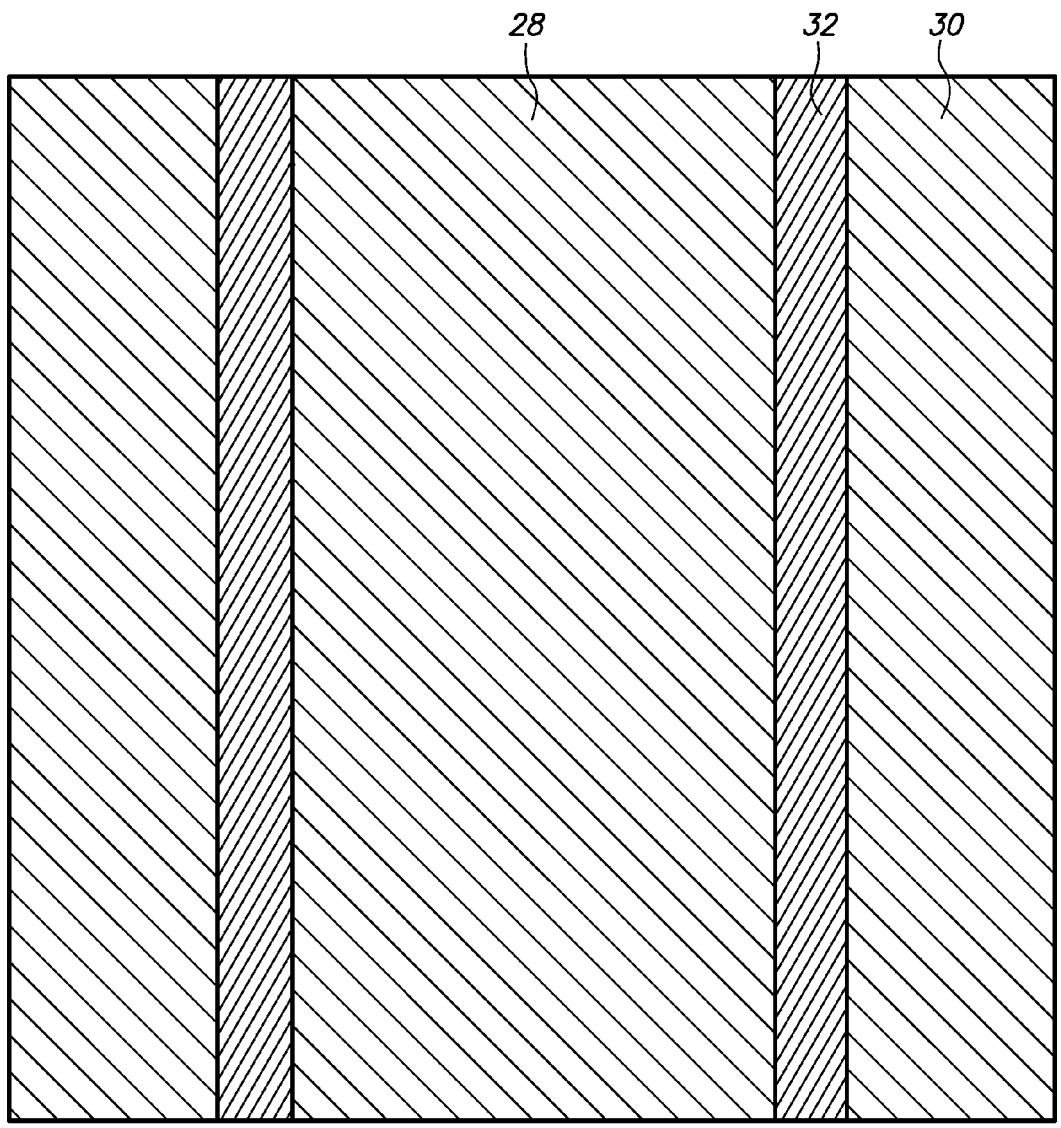

FIGS. 4A-4K are cross-sectional views showing a method of making a thermal board that includes thermal post 24, signal post 26, base 28, terminal 30, adhesive 32 and substrate 38 in accordance with an embodiment of the present invention, and FIGS. 4L and 4M are top and bottom views, respectively, corresponding to FIG. 4K.

FIG. 4A is a cross-sectional view of the structure with adhesive 32 mounted on base 28 and terminal 30. Adhesive 32 is mounted by lowering it onto base 28 as thermal post 24 is inserted into and through and upwards in opening 34 and signal post 26 is inserted into and through and upwards in opening 36. Adhesive 32 eventually contacts and rests on base 28 and terminal 30. Preferably, thermal post 24 is inserted into and extends through opening 34 without contacting adhesive 32 and is aligned with and centrally located within opening 34, and signal post 26 is inserted into and extends through opening 36 without contacting adhesive 32 and is aligned with and centrally located within opening 36. Adhesive 32 also covers slot 22 in the upward direction.

FIG. 4B is a cross-sectional view of the structure with substrate 38 mounted on adhesive 32. Substrate 38 is mounted by lowering it onto adhesive 32 as thermal post 24 is inserted into and upwards in aperture 44 and signal post 26 is inserted into and upwards in aperture 46. Substrate 38 eventually contacts and rests on adhesive 32.

Thermal post 24 is inserted into but not through aperture 44 without contacting substrate 38 and is aligned with and centrally located within aperture 44. As a result, gap 50 is located in aperture 44 between thermal post 24 and substrate 38. Gap 50 laterally surrounds thermal post 24 and is laterally surrounded by substrate 38. In addition, opening 34 and aperture 44 are precisely aligned with one another and have the same diameter.

Signal post 26 is inserted into but not through aperture 46 without contacting substrate 38 and is aligned with and centrally located within aperture 46. As a result, gap 52 is located in aperture 46 between signal post 26 and substrate 38. Gap 52 laterally surrounds signal post 26 and is laterally surrounded by substrate 38. In addition, opening 36 and aperture 46 are precisely aligned with one another and have the same diameter.

At this stage, substrate 38 is mounted on and contacts and extends above adhesive 32. Thermal post 24 extends through opening 34 into aperture 44 to dielectric layer 42, is 60 microns below the top surface of conductive layer 40 and is exposed through aperture 44 in the upward direction. Signal post 26 extends through opening 36 into aperture 46 to dielectric layer 42, is 60 microns below the top surface of conductive layer 40 and is exposed through aperture 46 in the upward direction. Adhesive 32 contacts and is sandwiched between base 28 and substrate 38, contacts dielectric layer 42 but is spaced from conductive layer 40, covers slot 22 in the upward direction and remains non-solidified prepreg with B-stage uncured epoxy, and slot 22 and gaps 50 and 52 are filled with air.

FIG. 4C is a cross-sectional view of the structure with adhesive 32 in slot 22 and gaps 50 and 52. Adhesive 32 is flowed into slot 22 and gaps 50 and 52 by applying heat and pressure. In this illustration, adhesive 32 is forced into slot 22 and gaps 50 and 52 by applying downward pressure to conductive layer 40 and/or upward pressure to base 28 and terminal 30, thereby moving base 28 and terminal 30 towards substrate 38 and applying pressure to adhesive 32 while simultaneously applying heat to adhesive 32. Adhesive 32 becomes compliant enough under the heat and pressure to conform to virtually any shape. As a result, adhesive 32 sandwiched between base 28 and substrate 38 and between terminal 30 and substrate 38 is compressed, forced out of its original shape and flows into and upward in gaps 50 and 52 and into and downward in slot 22. Base 28 and terminal 30 continue to move towards substrate 38 and adhesive 32 eventually fills slot 22 and gaps 50 and 52. Moreover, adhesive 32 remains sandwiched between and continues to fill the reduced space between base 28 and substrate 38 and between terminal 30 and substrate 38.

For instance, base 28, terminal 30 and conductive layer 40 can be disposed between top and bottom platens (not shown) of a press. In addition, a top cull plate and top buffer paper (not shown) can be sandwiched between conductive layer 40 and the top platen, and a bottom cull plate and bottom buffer paper (not shown) can be sandwiched between base 28 and the bottom platen and between terminal 30 and the bottom platen. The stack includes the top platen, top cull plate, top buffer paper, substrate 38, adhesive 32, base 28 and terminal 30, bottom buffer paper, bottom cull plate and bottom platen in descending order. Furthermore, the stack may be positioned on the bottom platen by tooling pins (not shown) that extend upward from the bottom platen through registration holes (not shown) in metal plate 10.

The platens are heated and move towards one another, thereby applying heat and pressure to adhesive 32. The cull plates disperse the heat from the platens so that it is more uniformly applied to base 28, terminal 30 and substrate 38 and thus adhesive 32, and the buffer papers disperse the pressure from the platens so that it is more uniformly applied to base 28, terminal 30 and substrate 38 and thus adhesive 32. Initially, dielectric layer 42 contacts and presses down on adhesive 32. As the platen motion and heat continue, adhesive 32 between base 28 and substrate 38 and between terminal 30 and substrate 38 is compressed, melted and flows into and upward in gaps 50 and 52 and across dielectric layer 42 to conductive layer 40 as well as into and downward in slot 22 across base 28 and terminal 30. For instance, the uncured epoxy is melted by the heat and the molten uncured epoxy is squeezed by the pressure into slot 22 and gaps 50 and 52, however the reinforcement and the filler remain between base 28 and substrate 38 and between terminal 30 and substrate 38.

Adhesive 32 ascends in gaps 50 and 52 more rapidly than thermal post 24 in aperture 44 and fills gap 50, and elevates more rapidly than signal post 26 in aperture 46 and fills gap 52. Adhesive 32 also rises slightly above gaps 50 and 52, overflows onto the top surfaces of thermal post 24 and conductive layer 40 adjacent to gap 50 and overflows onto the top surfaces of signal post 26 and conductive layer 40 adjacent to gap 52 before the platen motion stops. This may occur due to the prepreg being slightly thicker than necessary. As a result, adhesive 32 creates a thin coating on the top surfaces of thermal post 24, signal post 26 and conductive layer 40.

Adhesive 32 descends in and fills slot 22. Adhesive 32 also extends slightly below slot 22 and overflows onto the bottom surfaces of base 28 and terminal 30 adjacent to slot 22 before the platen motion stops. This may occur due to the prepreg being slightly thicker than necessary. As a result, adhesive 32 creates a thin coating on the bottom surfaces of base 28 and terminal 30.

The platen motion is eventually blocked by posts 24 and 26 and the platens become stationary but continue to apply heat to adhesive 32.

The upward flow of adhesive 32 in gaps 50 and 52 is shown by the thick upward arrows, downward flow of adhesive 32 in slot 22 is shown by the thick downward arrows, the upward motion of posts 24 and 26, base 28 and terminal 30 relative to substrate 38 is shown by the thin upward arrows, and the downward motion of substrate 38 relative to posts 24 and 26, base 28 and terminal 30 is shown by the thin downward arrows.

FIG. 4D is a cross-sectional view of the structure with adhesive 32 solidified.

For instance, the platens continue to clamp thermal post 24, signal post 26, base 28 and terminal 30 and apply heat after the platen motion stops, thereby converting the B-stage molten uncured epoxy into C-stage cured or hardened epoxy. Thus, the epoxy is cured in a manner similar to conventional multi-layer lamination. After the epoxy is cured, the platens move away from one another and the structure is released from the press.

Adhesive 32 as solidified provides a secure robust mechanical bond between thermal post 24 and substrate 38, between signal post 26 and substrate 38, between base 28 and substrate 38 and between terminal 30 and substrate 38. Adhesive 32 can withstand normal operating pressure without distortion or damage and is only temporarily distorted under unusually high pressure. Furthermore, adhesive 32 can absorb thermal expansion mismatch between thermal post 24 and substrate 38, between signal post 26 and substrate 38, between base 28 and substrate 38 and between terminal 30 and substrate 38.

At this stage, thermal post 24, signal post 26 and conductive layer 40 are essentially coplanar with one another and adhesive 32 and conductive layer 40 extend to a top surface that faces in the upward direction. For instance, adhesive 32 between base 28 and dielectric layer 42 has a thickness of 90 microns which is 60 microns less than its initial thickness of 150 microns, thermal post 24 ascends 60 microns in aperture 44, signal post 26 ascends 60 microns in aperture 46 and substrate 38 descends 60 microns relative to posts 24 and 26. The 250 micron height of thermal post 24 and of signal post 26 is essentially the same as the combined height of conductive layer 40 (30 microns), dielectric layer 42 (130 microns) and the underlying adhesive 32 (90 microns). Furthermore, thermal post 24 continues to be centrally located in opening 34 and aperture 44 and spaced from substrate 38, signal post 26 continues to be centrally located in opening 36 and aperture 46 and spaced from substrate 38 and adhesive 32 fills the space between base 28 and substrate 38 and fills gaps 50 and 52. For instance, gap 50 (as well as adhesive 32 between thermal post 24 and substrate 38) has a width of 75 microns ((1150−1000)/2) at the top surface of thermal post 24, and gap 52 (as well as adhesive 32 between signal post 26 and substrate 38) has a width of 75 microns ((450−300)/2) at the top surface of signal post 26. Adhesive 32 extends across dielectric layer 42 in gaps 50 and 52. That is, adhesive 32 in gap 50 extends in the upward and downward directions across the thickness of dielectric layer 42 at the outer sidewall of gap 50, and adhesive 32 in gap 52 extends in the upward and downward directions across the thickness of dielectric layer 42 at the outer sidewall of gap 52.

Base 28 and terminal 30 remain coplanar with one another and base 28, terminal 30 and adhesive 32 extend to a bottom surface that faces in the downward direction. Furthermore, adhesive 32 fills slot 22 and extends across base 28 and terminal 30 in slot 22. That is, adhesive 32 in slot 22 extends in the upward and downward directions across the thickness of base 28 and terminal 30 at the opposing major sidewalls of slot 22 that provide the edges of base 28 and terminal 30, respectively.

Adhesive 32 also includes thin top portions above gaps 50 and 52 that contact the top surfaces of posts 24 and 26 and conductive layer 40 and extend above posts 24 and 26 by 10 microns, and thin bottom portions below slot 22 that contact the bottom surfaces of base 28 and terminal 30 and extend below base 28 and terminal 30 by 10 microns.

FIG. 4E is a cross-sectional view of the structure after upper portions of thermal post 24, signal post 26, adhesive 32 and conductive layer 40 are removed and lower portions of base 28, terminal 30 and adhesive 32 are removed.

Thermal post 24, signal post 26, adhesive 32 and conductive layer 40 have their upper portions removed by grinding. For instance, a rotating diamond sand wheel and distilled water are applied to the top of the structure. Initially, the diamond sand wheel grinds only adhesive 32. As the grinding continues, adhesive 32 becomes thinner as its grinded surface migrates downwardly. Eventually the diamond sand wheel contacts posts 24 and 26 and conductive layer (not necessarily at the same time), and as a result, begins to grind posts 24 and 26 and conductive layer 40 as well. As the grinding continues, posts 24 and 26, adhesive 32 and conductive layer 40 become thinner as their grinded surfaces migrate downwardly. The grinding continues until the desired thickness has been removed. Thereafter, the structure is rinsed in distilled water to remove contaminants.

The grinding removes a 25 micron thick upper portion of adhesive 32, a 15 micron thick upper portion of thermal post 24, a 15 micron thick upper portion of signal post 26 and a 15 micron thick upper portion of conductive layer 40. The decreased thickness does not appreciably affect thermal post 24, signal post 26 or adhesive 32. However, it substantially reduces the thickness of conductive layer 40 from 30 microns to 15 microns.

Base 28, terminal 30 and adhesive 32 have their lower portions removed by grinding. For instance, a rotating diamond sand wheel and distilled water are applied to the bottom of the structure. Initially, the diamond sand wheel grinds only adhesive 32. As the grinding continues, adhesive 32 becomes thinner as its grinded surface migrates upwardly. Eventually the diamond sand wheel contacts base 28 and terminal 30 (not necessarily at the same time), and as a result, begins to grind base 28 and terminal 30 as well. As the grinding continues, base 28, terminal 30 and adhesive 32 become thinner as their grinded surfaces migrate upwardly. The grinding continues until the desired thickness has been removed. Thereafter, the structure is rinsed in distilled water to remove contaminants.

The grinding removes a 25 micron lower portion of adhesive 32, a 15 micron thick lower portion of base 28 and a 15 micron thick lower portion of terminal 30. The decreased thickness does not appreciably affect base 28, terminal 30 or adhesive 32.

At this stage, thermal post 24, signal post 26, adhesive 32 and conductive layer 40 are coplanar with one another at a smoothed lapped lateral top surface that is above dielectric layer 42 and faces in the upward direction. Likewise, base 28, terminal 30 and adhesive 32 are coplanar with one another at a smoothed lapped lateral bottom surface that is below posts 24 and 26 and faces in the downward direction.

FIG. 4F is a cross-sectional view of the structure with conductive layer 54 deposited on thermal post 24, signal post 26, adhesive 32 and conductive layer 40 and conductive layer 56 deposited on base 28, terminal 30 and adhesive 32.

Conductive layer 54 contacts thermal post 24, signal post 26, adhesive 32 and conductive layer 40 and covers them in the upward direction. Likewise, conductive layer 56 contacts base 28, terminal 30 and adhesive 32 and covers them in the downward direction. For instance, the structure is dipped in an activator solution to render adhesive 32 catalytic to electroless copper, then a first top copper layer is electrolessly plated on thermal post 24, signal post 26, adhesive 32 and conductive layer 40 and a first bottom copper layer is electrolessly plated on base 28, terminal 30 and adhesive 32, and then a second top copper layer is electroplated on the first top copper layer and a second bottom copper layer is electroplated on the first bottom copper layer. The first copper layers have a thickness of 2 microns, the second copper layers have a thickness of 13 microns, and conductive layers 54 and 56 have a thickness of 15 microns. As a result, conductive layer 40 essentially grows and has a thickness of 30 microns (15+15) and base 28 and terminal 30 essentially grow and have a thickness of 180 microns (165+15). Conductive layer 54 serves as a cover layer for thermal post 24 and signal post 26 and a build-up layer for conductive layer 40. However, conductive layer 56 is a sacrificial layer as discussed below.

Thermal post 24, signal post 26 and conductive layers 40 and 54 are shown as a single layer for convenience of illustration Likewise, base 28, terminal 30 and conductive layer 56 are shown as a single layer for convenience of illustration. The boundary (shown in phantom) between thermal post 24 and conductive layer 54, between signal post 26 and conductive layer 54, between conductive layers 40 and 54, between base 28 and conductive layer 56 and between terminal 30 and conductive layer 56 may be difficult or impossible to detect since copper is plated on copper. However, the boundary between adhesive 32 and conductive layers 54 and 56 is clear.

FIG. 4G is a cross-sectional view of the structure with etch mask 58 formed on the top surface of the structure. Etch mask 58 is illustrated as a photoresist layer similar to photoresist layer 16. Photoresist layer 58 has a pattern that selectively exposes conductive layer 54, and conductive layer 56 remains fully exposed.

FIG. 4H is a cross-sectional view of the structure with selected portions of conductive layers 40 and 54 removed by etching conductive layers 40 and 54 in the pattern defined by etch mask 58 and with conductive layer 56 removed by blanket etching.

The etching is a front-side and back-side wet chemical etch. For instance, a top spray nozzle (not shown) and a bottom spray nozzle (not shown) can spray the wet chemical etch on the top and bottom of the structure, or the structure can be dipped in the wet chemical etch. The wet chemical etch etches through conductive layers 40 and 54 to expose adhesive 32 and dielectric layer 42 in the upward direction and converts conductive layers 40 and 54 from unpatterned into patterned layers. The wet chemical etch also removes conductive layer 56 to expose base 28, terminal 30 and adhesive 32 in the downward direction.

Conductive layer 56 is thus a sacrificial layer. Alternatively, a cover mask can prevent conductive layer 56 from plating on the structure. However, conductive layer 56 may deposit on the cover mask, thereby inhibiting the solvent from subsequently removing the cover mask and creating copper flakes in the solvent.

Furthermore, the front-side and backside-side wet chemical etches etch 30 microns into the structure. As a result, base 28 and terminal 30 are slightly overetched to ensure that conductive layer 56 is completely removed and adhesive 32 extends below base 28 and terminal 30 by 15 microns (30−15) to avoid solder bridging between base 28 and terminal 30 during the next level assembly.

FIG. 4I is a cross-sectional view of the structure after etch mask 58 is removed. Photoresist layer 58 can be stripped in the same manner as photoresist layer 16.

Conductive layers 40 and 54 as etched include pad 60 and cap 62. Pad 60 and cap 62 are unetched portions of conductive layers 40 and 54 defined by etch mask 58. Thus, conductive layers 40 and 54 are a patterned layer that includes pad 60 and cap 62. Furthermore, thermal post 24 is adjacent to and thermally connects base 28 and cap 62, and signal post 26 is adjacent to and electrically connects terminal 30 and pad 60.

Pad 60 extends above and is adjacent to and covers in the upward direction and extends laterally in the lateral directions from the top of signal post 26. Pad 60 also contacts the underlying portion of adhesive 32 that is coplanar with and adjacent to and laterally surrounds signal post 26 and covers this portion in the upward direction.

Cap 62 extends above and is adjacent to and covers in the upward direction and extends laterally in the lateral directions from the top of thermal post 24. Cap 62 is positioned so that thermal post 24 is centrally located within its periphery. Cap 62 also contacts the underlying portion of adhesive 32 that is coplanar with and adjacent to and laterally surrounds thermal post 24 and covers this portion in the upward direction.

Conductive trace 64 is provided by signal post 26, terminal 30 and pad 60. Similarly, an electrically conductive path between terminal 30 and pad 60 is signal post 26. Conductive trace 64 provides vertical (top to bottom) routing from pad 60 to terminal 30. Conductive trace 64 is not be limited to this configuration. For instance, the electrically conductive path can include vias that extend through dielectric layer 42 and routing lines (above and/or below dielectric layer 42) as well as passive components such as resistors and capacitors mounted on additional pads.

Heat spreader 66 includes thermal post 24, base 28 and cap 62. Similarly, a thermally conductive path between base 28 and cap 62 is thermal post 24. Heat spreader 66 is essentially a heat slug with an I-like shape that includes a pedestal (thermal post 24), lower wings (base 28 portions that extend laterally from the pedestal) and upper wings (cap 62 portions that extend laterally from the pedestal).

FIG. 4J is a cross-sectional view of the structure with plated contacts 68 formed on base 28, terminal 30, pad 60 and cap 62.

Plated contacts 68 are thin spot plated metal coatings that contact base 28 and terminal 30 and cover their exposed portions in the downward direction and contact pad 60 and cap 62 and cover their exposed portions in the upward direction. For instance, a nickel layer is electrolessly plated on base 28, terminal 30, pad 60 and cap 62, and then a silver layer is electrolessly plated on the nickel layer. The buried nickel layer has a thickness of 3 microns, the silver surface layer has a thickness of 0.5 microns, and plated contacts 68 have a thickness of 3.5 microns.

Base 28, terminal 30, pad 60 and cap 62 treated with plated contacts 68 as a surface finish have several advantages. The buried nickel layer provides the primary mechanical and electrical and/or thermal connection, and the silver surface layer provides a wettable surface to facilitate solder reflow and accommodates a solder joint and a wire bond. Plated contacts 68 also protect base 28, terminal 30, pad 60 and cap 62 from corrosion. Plated contacts 68 can include a wide variety of metals to accommodate the external connection media. For instance, a gold surface layer can be plated on a buried nickel layer.

Base 28, terminal 30, pad 60 and cap 62 treated with plated contacts 68 are shown as single layers for convenience of illustration. The boundary (not shown) with plated contacts 68 in base 28, terminal 30, pad 60 and cap 62 occurs at the copper/nickel interface.

At this stage, the manufacture of thermal board 70 can be considered complete.

FIGS. 4K, 4L and 4M are cross-sectional, top and bottom views, respectively, of thermal board 70 after it is detached at peripheral edges along cut lines from a support frame and/or adjacent thermal boards in a batch.

Thermal board 70 includes adhesive 32, substrate 38, conductive trace 64 and heat spreader 66. Substrate 38 includes dielectric layer 42. Conductive trace 64 includes signal post 26, terminal 30 and pad 60. Heat spreader 66 includes thermal post 24, base 28 and cap 62.

Thermal post 24 extends through opening 34 and into aperture 44, remains centrally located within opening 34 and aperture 44 and is coplanar at its top with an adjacent portion of adhesive 32 above dielectric layer 42 and at its bottom with an adjacent portion of adhesive 32 that contacts base 28. Thermal post 24 retains its cut-off conical shape with tapered sidewalls in which its diameter decreases as it extends upwardly from base 28 to its flat circular top adjacent to cap 62.

Signal post 26 extends through opening 36 and into aperture 46, remains centrally located within opening 36 and aperture 46 and is coplanar at its top with an adjacent portion of adhesive 32 above dielectric layer 42 and at its bottom with an adjacent portion of adhesive 32 that contacts terminal 30. Signal post 26 retains its cut-off conical shape with tapered sidewalls in which its diameter decreases as it extends upwardly from terminal 30 to its flat circular top adjacent to pad 60.

Base 28 covers thermal post 24 in the downward direction, extends to two peripheral edges and is spaced from two other peripheral edges of thermal board 70.

Adhesive 32 is mounted on and extends above base 28, contacts and is sandwiched between and fills the space between thermal post 24 and dielectric layer 42 in gap 50, contacts and is sandwiched between and fills the space between signal post 26 and dielectric layer 42 in gap 52, contacts and is sandwiched between and fills the space between base 28 and dielectric layer 42 in outside gaps 50 and 52, contacts and is sandwiched between and fills the space between terminal 30 and dielectric layer 42 outside gaps 50 and 52, and contacts and is sandwiched between and fills the space between base 28 and terminal 30 outside gaps 50 and 52. Adhesive 32 also extends laterally from thermal post 24 to and overlaps terminal 30, covers base 28 outside the periphery of thermal post 24 in the upward direction, covers terminal 30 outside the periphery of signal post 26 in the upward direction, covers and surrounds thermal post 24 and signal post 26 in the lateral directions, provides a downwardly protruding separation wall between base 28 and terminal 30, fills most of the space between substrate 38 and heat spreader 66 and is solidified.

Substrate 38 is mounted on and contacts adhesive 32, extends above the underlying adhesive 32 and extends above base 28, conductive layer 40 (as well as pad 60 and cap 62) contacts and extends above dielectric layer 42, and dielectric layer 42 contacts and is sandwiched between adhesive 32 and conductive layer 40.

Thermal post 24 and signal post 26 have the same thickness and are coplanar with one another, and base 28 and terminal 30 have the same thickness and are coplanar with one another. Furthermore, posts 24 and 26 are coplanar with adhesive 32 at their tops, and base 28 and terminal 30 are essentially coplanar with adhesive 32 at their bottoms.

Thermal post 24, base 28 and cap 60 remain spaced from signal post 26, terminal 30 and pad 60. As a result, conductive trace 64 and heat spreader 66 are mechanically attached and electrically isolated from one another.

Base 28, terminal 30, adhesive 32 and dielectric layer 42 extend to straight vertical peripheral edges of thermal board 70 after it is detached or singulated from a batch of identical simultaneously manufactured thermal boards.

Pad 60 is customized as an electrical interface for a semiconductor device such as an LED package or a semiconductor chip that is subsequently mounted on cap 62, terminal 30 is customized as an electrical interface for the next level assembly such as a solderable wire from a printed circuit board, cap 62 is customized as a thermal interface for the semiconductor device, and base 28 is customized as a thermal interface for the next level assembly such as the printed circuit board or a heat sink for an electronic device.

Terminal 30 and pad 60 are vertically offset from one another and exposed at the top and bottom surfaces, respectively, of thermal board 70, thereby providing vertical routing between the semiconductor device and the next level assembly. Furthermore, detaching thermal board 70 from the batch provides two additional edges for base 28 and three additional edges for terminal 30 at the peripheral edges of thermal board 70.

Pad 60 and cap 62 are coplanar with one another at their top surfaces above adhesive 32 and dielectric layer 42, and base 28 and terminal 30 are coplanar with one another at their bottom surfaces below dielectric layer 42.

Conductive trace 64 is shown in cross-section as a continuous circuit trace for convenience of illustration. However, conductive trace 64 typically provides horizontal signal routing in both the X and Y directions. That is, terminal 30 and pad 60 are laterally offset from one another in the X and Y directions.

Heat spreader 66 provides heat spreading and heat dissipation from a semiconductor device that is subsequently mounted on cap 62 to the next level assembly that thermal board 70 is subsequently mounted on. The semiconductor device generates heat that flows into cap 62, from cap 62 into thermal post 24 and through thermal post 24 into base 28 where it is spread out and dissipated in the downward direction, for instance to an underlying heat sink.

Plated contacts 68 occupy 85 to 95 percent of the top surface of thermal board 70 and thus provide a highly reflective top surface which is particularly useful if an LED device is subsequently mounted on cap 62.

Thermal board 70 does not expose thermal post 24 or signal post 26. Thermal post 24 is covered by base 28 and cap 62, and signal post 26 is covered by terminal 30 and pad 60. Thermal post 24 and signal post 26 are shown in phantom in FIG. 4L for convenience of illustration.

Thermal board 70 includes other conductive traces 64 that typically include signal post 26, terminal 30 and pad 60. A single conductive trace 64 is described and labeled for convenience of illustration. In conductive traces 64, signal posts 24, terminals 30 and pads 60 generally have similar shapes and sizes. For instance, some conductive traces 64 may be spaced and separated and electrically isolated from one another whereas other conductive traces 64 can intersect or route to the same terminal 30 or pad 60 and be electrically connected to one another. Likewise, some pads 60 may receive independent signals whereas other pads 60 share a common signal, power or ground.

Thermal board 70 can be adapted for an LED package with blue, green and red LED chips, with each LED chip including an anode and a cathode and each LED package including a corresponding anode terminal and cathode terminal. In this instance, thermal board 70 can include six pads 60 and four terminals 30 so that each anode is routed from a separate pad 60 to a separate terminal 30 whereas each cathode is routed from a separate pad 60 to a common ground terminal 30.

A brief cleaning step can be applied to the structure at various manufacturing stages to remove oxides and debris that may be present on the exposed metal. For instance, a brief oxygen plasma cleaning step can be applied to the structure. Alternatively, a brief wet chemical cleaning step using a solution containing potassium permanganate can be applied to the structure. Likewise, the structure can be rinsed in distilled water to remove contaminants. The cleaning step cleans the desired surfaces without appreciably affecting or damaging the structure.

Advantageously, there is no plating bus or related circuitry that need be disconnected or severed from conductive traces 64 after they are formed. A plating bus can be disconnected during the wet chemical etch that forms pad 60 and cap 62.

Thermal board 70 can include registration holes (not shown) that are drilled or sliced through adhesive 32 and substrate 38 so that thermal board 70 can be positioned by inserting tooling pins through the registration holes when it is subsequently mounted on an underlying carrier.

Thermal board 70 can also include a top solder mask that selectively exposes pad 60 and cap 62 as well as a bottom solder mask that selectively exposes base 28 and terminal 30.

Thermal board 70 can omit cap 62. This can be accomplished by adjusting etch mask 58 to expose conductive layer 54 above all of aperture 44 to the wet chemical etch that forms pad 60. This can also be accomplished by omitting conductive layer 54.

Thermal board 70 can accommodate multiple semiconductor devices rather than one. This can be accomplished by adjusting etch mask 16 to define additional thermal posts 22, signal posts 24 and terminals 30, adjusting adhesive 32 to include additional openings 34 and 36, adjusting substrate 38 to include additional apertures 44 and 46 and adjusting etch mask 58 to define additional pads 60 and caps 62. These elements can be laterally repositioned to provide a 2×2 array for four semiconductor devices. In addition, the topography (lateral shape) can be adjusted for some but not all of the elements.

Figure 5A:
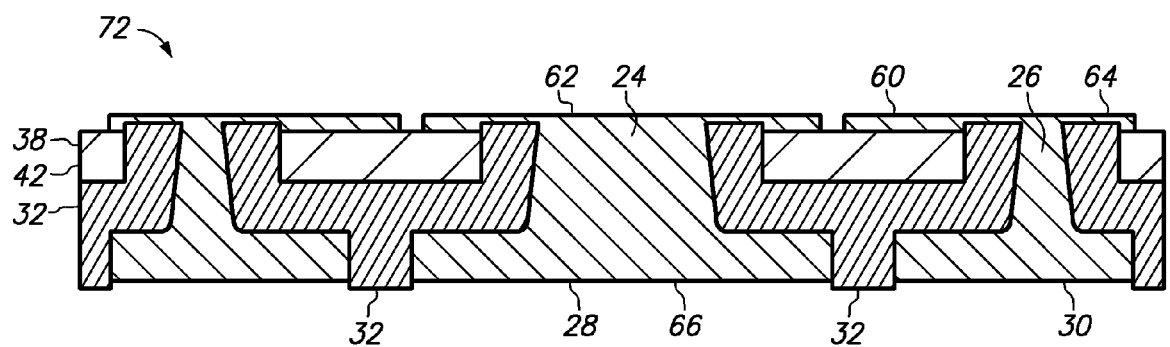
FIGS. 5A, 5B and 5C are cross-sectional, top and bottom views, respectively, of a thermal board with a base and a terminal spaced from the peripheral edges in accordance with an embodiment of the present invention.
Figure 5B:
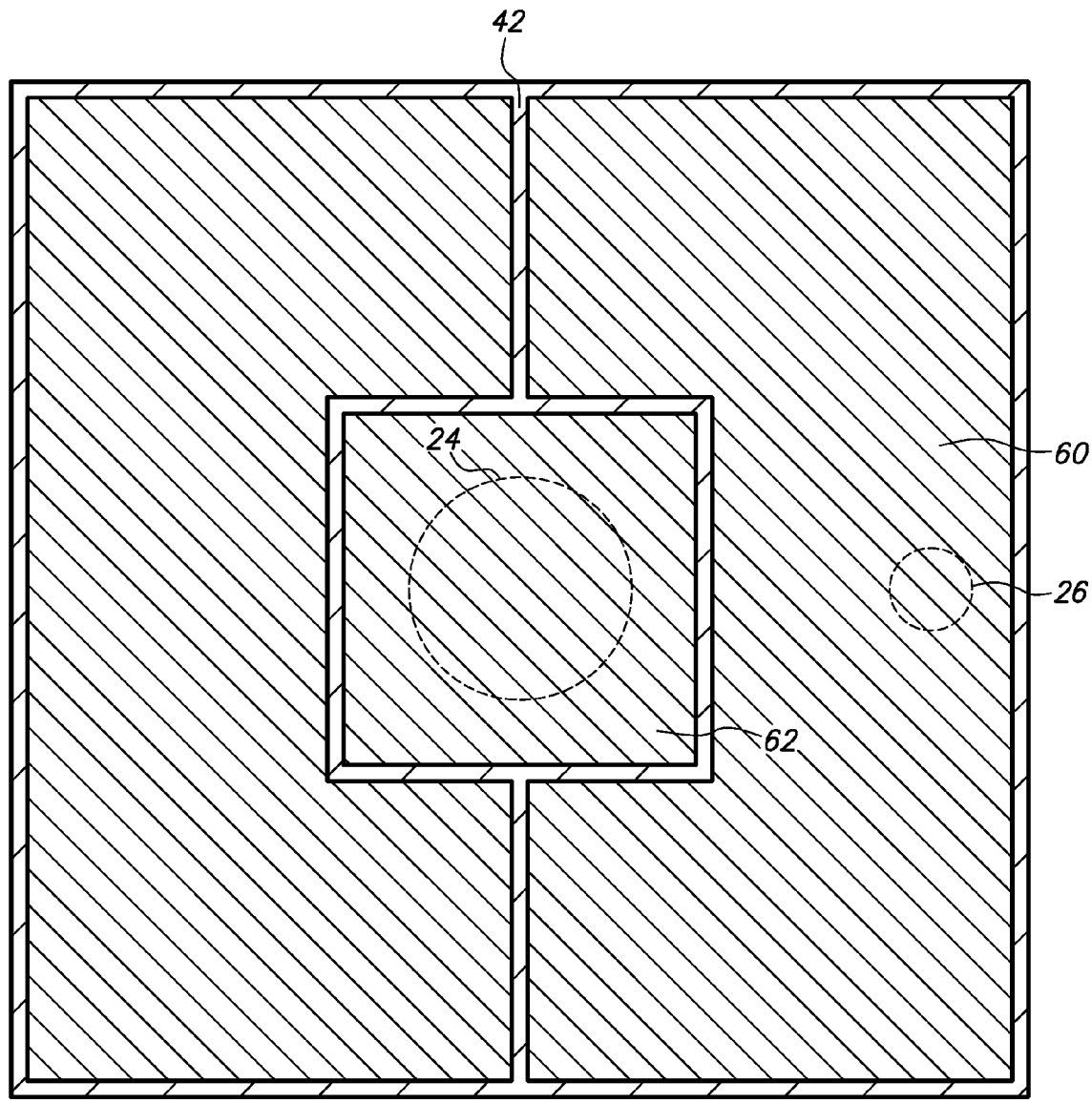
Figure 5C:
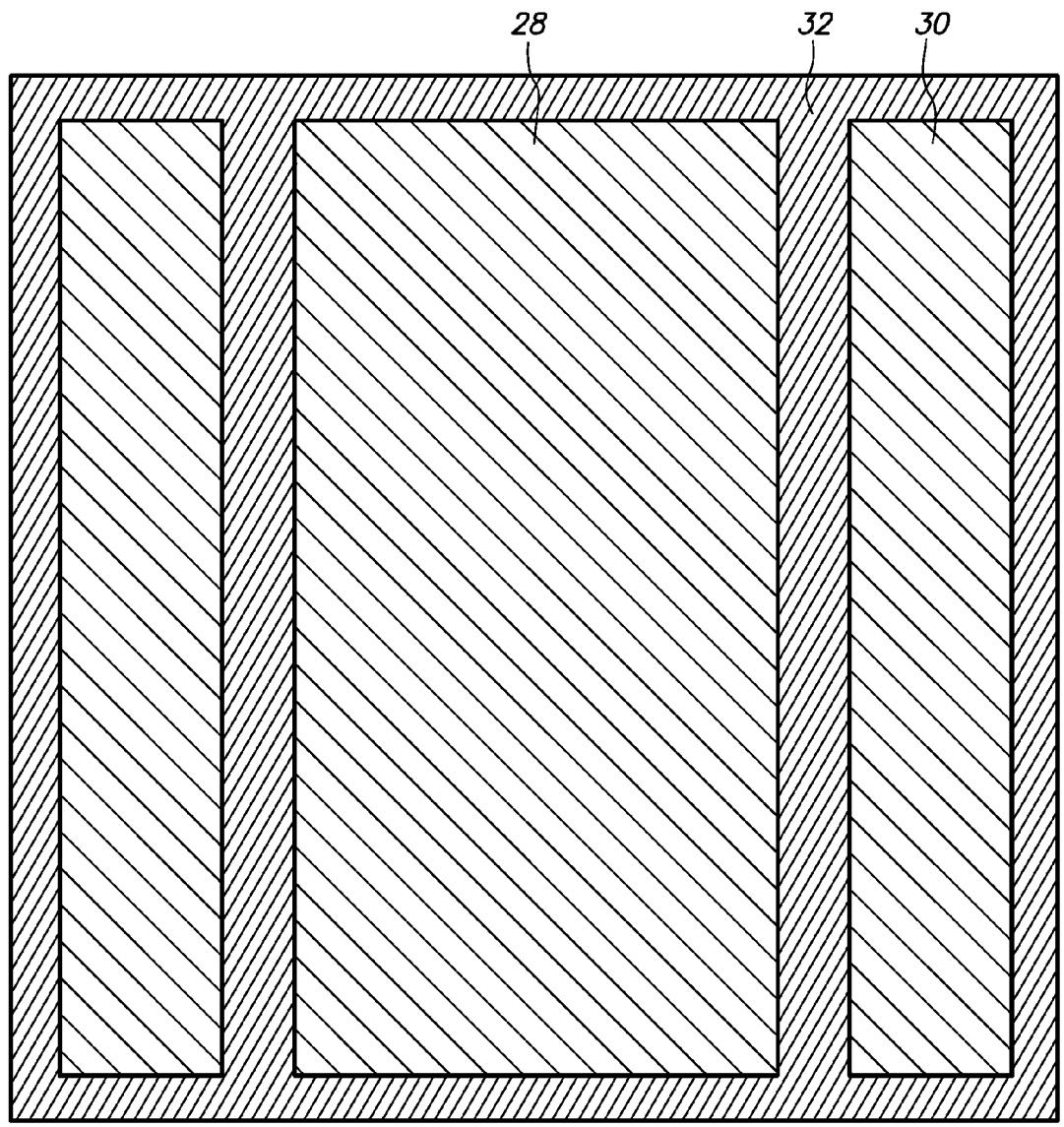

FIGS. 5A, 5B and 5C are cross-sectional, top and bottom views, respectively, of a thermal board with a base and a terminal spaced from the peripheral edges in accordance with an embodiment of the present invention.

In this embodiment, the base and the terminal are trimmed by adding an etch step. For purposes of brevity, any description of thermal board 70 is incorporated herein insofar as the same is applicable, and the same description need not be repeated Likewise, elements of the thermal board similar to those in thermal board 70 have corresponding reference numerals.

Thermal board 72 includes adhesive 32, conductive trace 64 and heat spreader 66. Conductive trace 64 includes signal post 26, terminal 30 and pad 60. Heat spreader 66 includes thermal post 24, base 28 and cap 62.

Base 28 and terminal 30 are spaced from the peripheral edges of thermal board 72. As a result, adhesive 32 extends from thermal post 24 beyond base 28 and terminal 30 in the lateral directions. Furthermore, base 28 supports substrate 38 and the peripheral edges include adhesive 32 and dielectric layer 42.

Thermal board 72 can be manufactured in a manner similar to thermal board 70 with suitable adjustments for base 28 and terminal 30. For instance, adhesive 32 is mounted on base 28 and terminal 30, substrate 38 is mounted on adhesive 32, heat and pressure are applied to flow and solidify adhesive 32, grinding is applied to planarize the top and bottom surfaces, conductive layers 54 and 56 are deposited on the top and bottom surfaces and then conductive layers 40 and 54 are etched to form pad 60 and cap 62 and conductive layer 56 is removed as previously described. Thereafter, a cover mask is formed on the top surface and an etch mask is formed on the bottom surface that defines the additional edges of base 28 and terminal 30, then metal plate 10 is etched in a pattern defined by the etch mask and then the masks are removed. Thereafter, plated contacts 68 provide a surface finish for base 28, terminal 30, pad 60 and cap 62.

Base 28 and terminal 30 need not be cut to detach thermal board 72 from other thermal boards in a batch since the additional edges of terminal 28 and base 30 are formed by etching (rather than cutting) and are spaced from (rather than located at) the peripheral edges of thermal board 72.

Figure 6A:
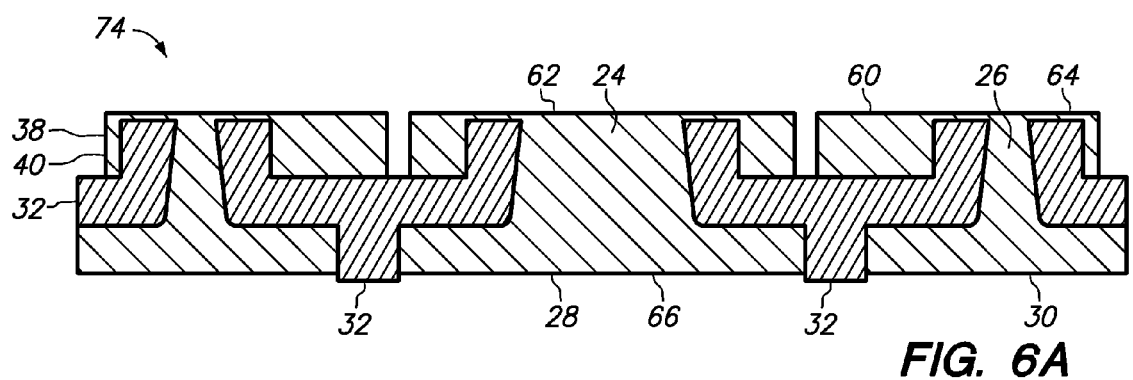
FIGS. 6A, 6B and 6C are cross-sectional, top and bottom views, respectively, of a thermal board with a conductive trace on an adhesive in accordance with an embodiment of the present invention.
Figure 6B:
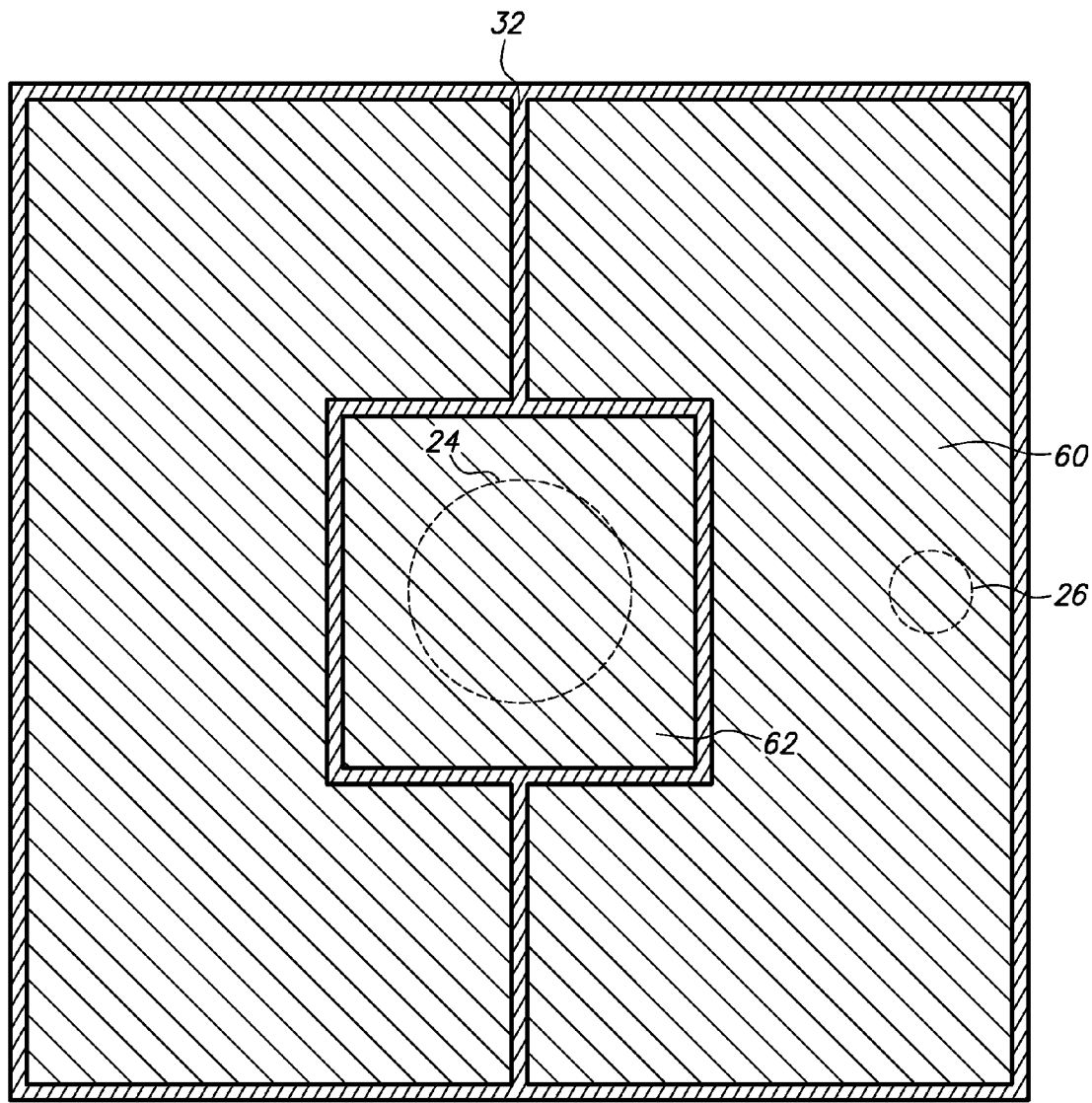
Figure 6C:
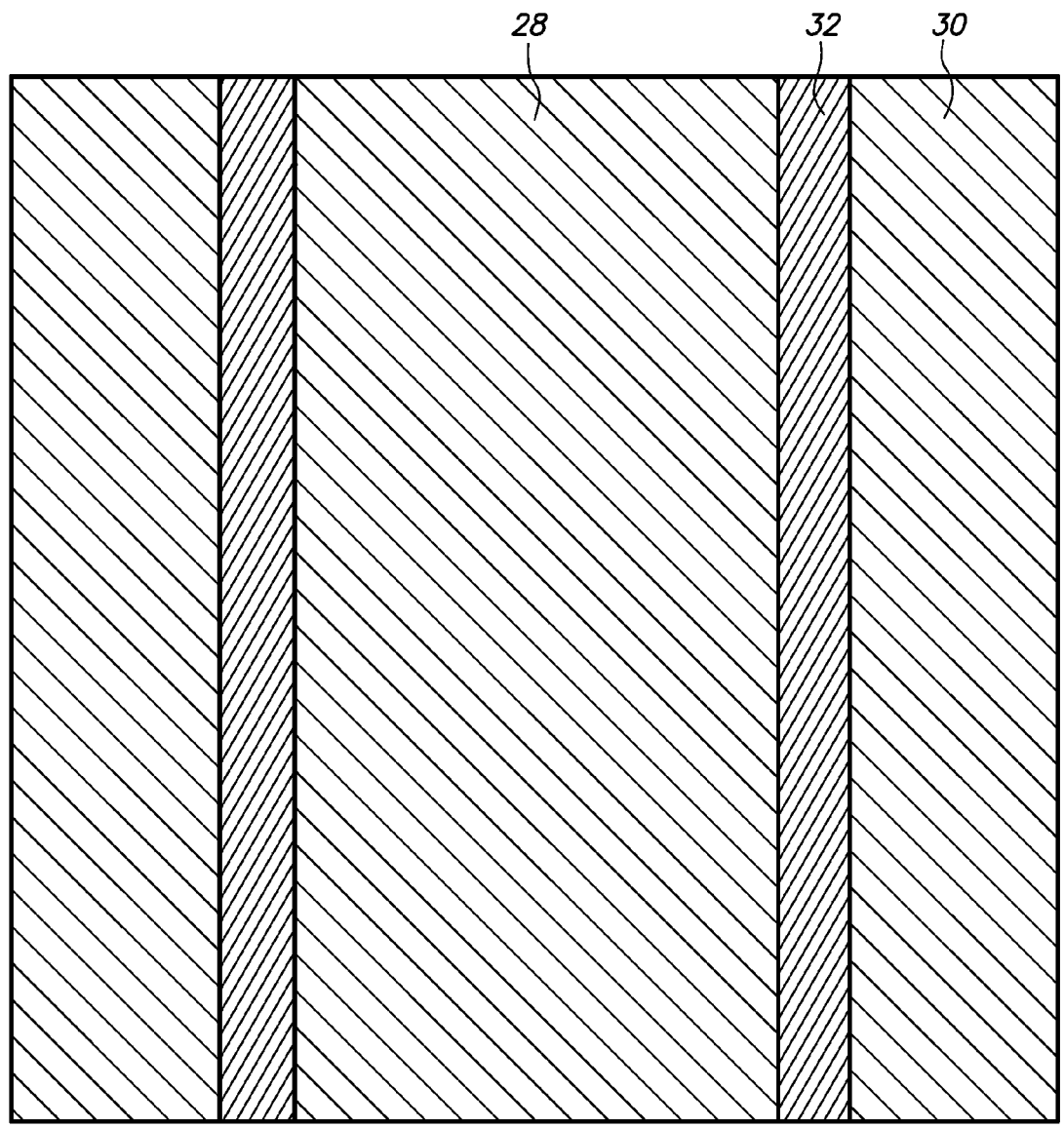

FIGS. 6A, 6B and 6C are cross-sectional, top and bottom views, respectively, of a thermal board with a conductive trace on an adhesive in accordance with an embodiment of the present invention.

In this embodiment, the conductive trace contacts the adhesive and the dielectric layer is omitted. For purposes of brevity, any description of thermal board 70 is incorporated herein insofar as the same is applicable, and the same description need not be repeated. Likewise, elements of the thermal board similar to those in thermal board 70 have corresponding reference numerals.

Thermal board 74 includes adhesive 32, conductive trace 64 and heat spreader 66. Conductive trace 64 includes signal post 26, terminal 30 and pad 60. Heat spreader 66 includes thermal post 24, base 28 and cap 62.

Conductive layer 40 is thicker in this embodiment than the previous embodiment. For instance, conductive layer 40 has a thickness of 130 microns (rather than 30 microns) so that it can be handled without warping or wobbling. Pad 60 is therefore thicker, and thermal board 74 is devoid of a dielectric layer corresponding to dielectric layer 42.

Thermal board 74 can be manufactured in a manner similar to thermal board 70 with suitable adjustments for thermal post 24, signal post 26 and conductive layer 40. For instance, metal plate 10 has a thickness of 350 microns (rather than 400 microns) so that posts 24 and 26 have a height of 200 microns (rather than 250 microns) and base 28 and terminal 30 have a thickness of 150 microns. This can be accomplished by reducing the etch time. Thereafter, adhesive 32 is mounted on base 28 and terminal 30, conductive layer 40 alone is mounted on adhesive 32, heat and pressure are applied to flow and solidify adhesive 32, grinding is applied to planarize the top and bottom surfaces and then conductive layers 54 and 56 are deposited on the top and bottom surfaces as previously described. Thereafter, conductive layers 40 and 54 are etched to form pad 60 and cap 62, conductive layer 56 is removed and then plated contacts 68 provide a surface finish for base 28, terminal 30, pad 60 and cap 62.

Figure 7A:
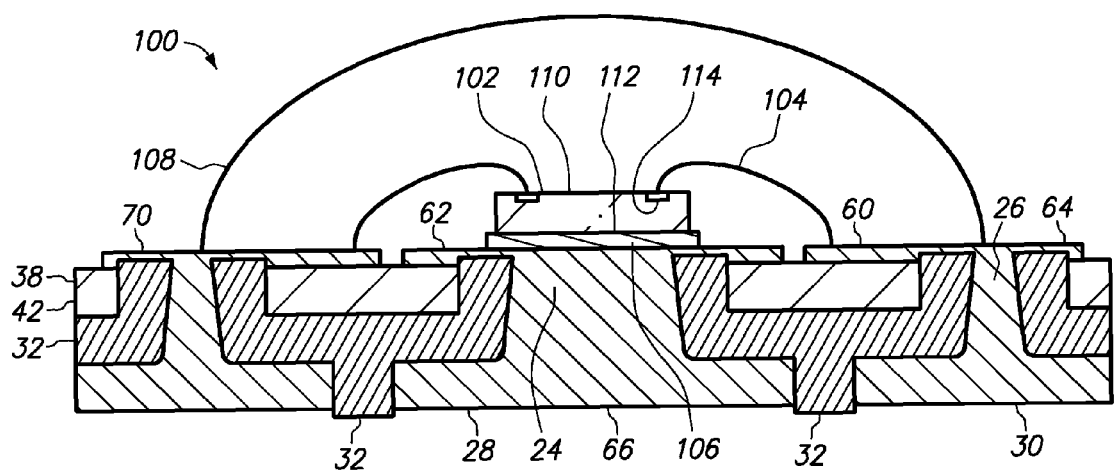
FIGS. 7A, 7B and 7C are cross-sectional, top and bottom views, respectively, of a semiconductor chip assembly that includes a thermal board and a semiconductor device in accordance with an embodiment of the present invention.
Figure 7B:
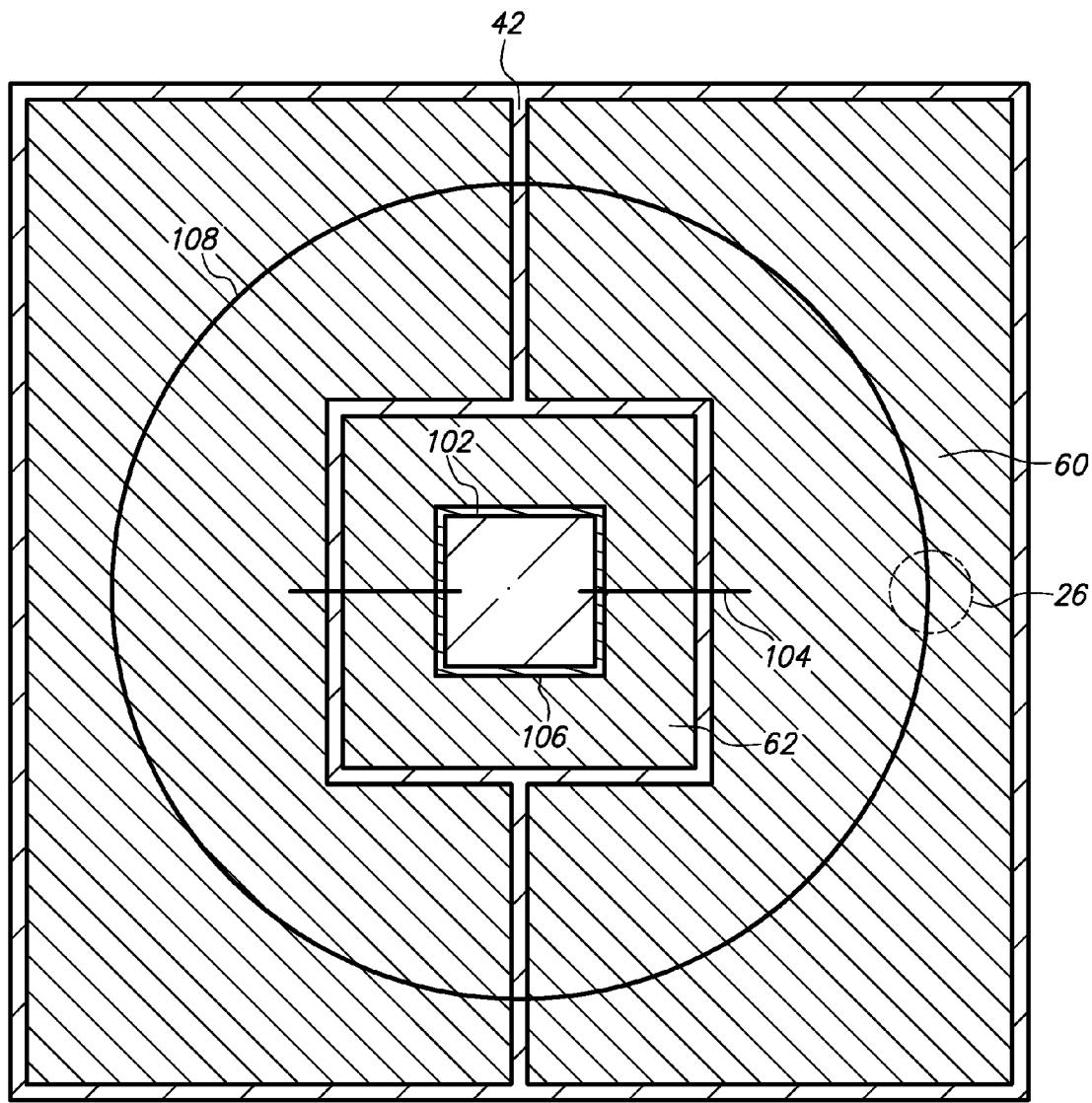
Figure 7C:
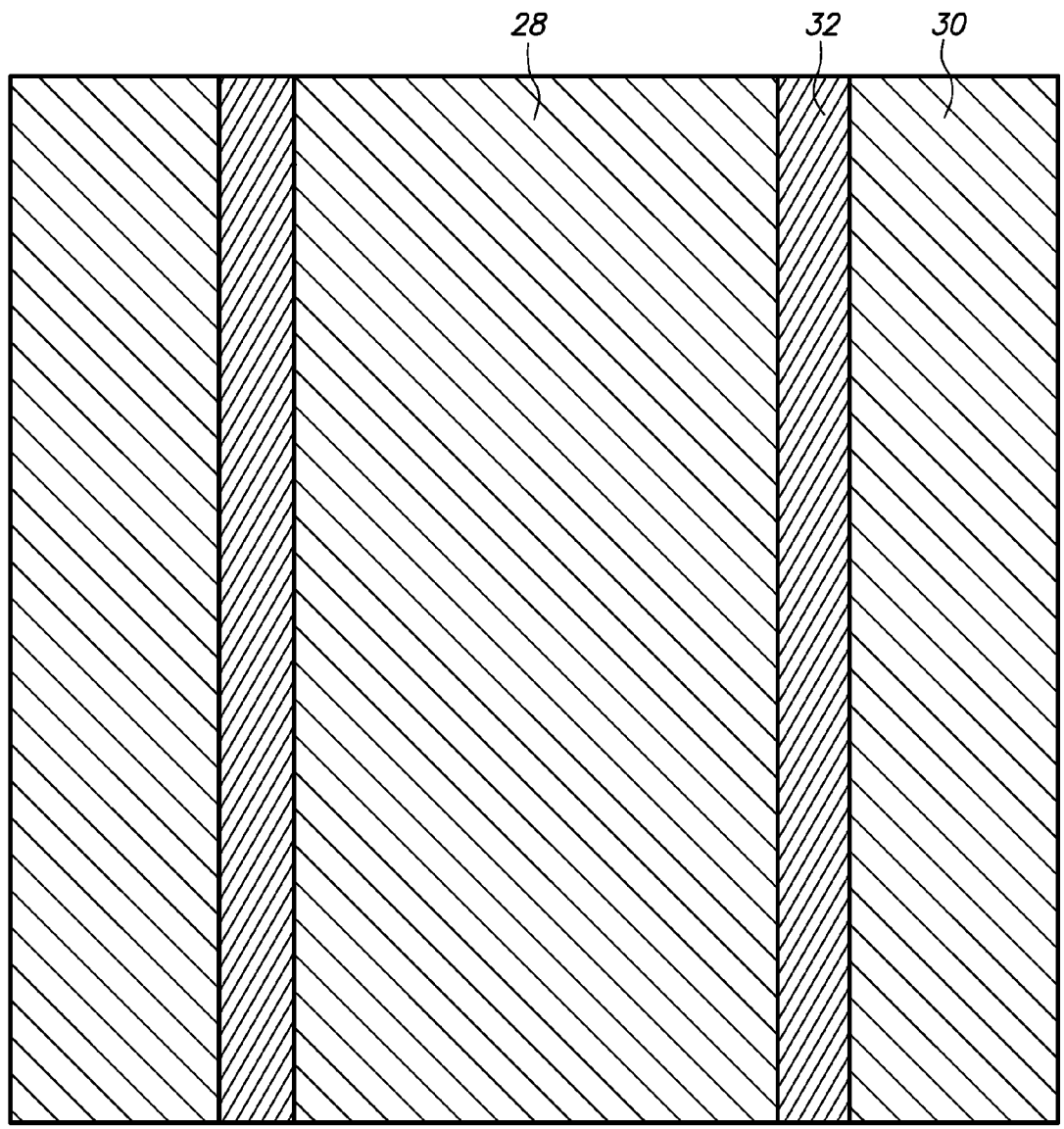

FIGS. 7A, 7B and 7C are cross-sectional, top and bottom views, respectively, of a semiconductor chip assembly that includes a thermal board and a semiconductor device in accordance with an embodiment of the present invention.

In this embodiment, the semiconductor device is an LED chip that emits blue light, is mounted on the heat spreader but not the substrate, overlaps the thermal post but not the substrate, is electrically connected to the pad using a wire bond, is thermally connected to the cap using a die attach and is covered by an encapsulant.

Semiconductor chip assembly 100 includes thermal board 70, LED chip 102, wire bond 104, die attach 106 and encapsulant 108. LED chip 102 includes top surface 110, bottom surface 112 and bond pad 114. Top surface 110 is the active surface and includes bond pad 114 and bottom surface 112 is the thermal contact surface.

LED chip 102 is mounted on heat spreader 66, electrically connected to substrate 38 and thermally connected to heat spreader 66. In particular, LED chip 102 is mounted on cap 62, is within the periphery of cap 62, overlaps thermal post 24 but does not overlap substrate 38, is electrically connected to substrate 38 by wire bond 104 and is thermally connected to and mechanically attached to heat spreader 66 by die attach 106. For instance, wire bond 104 is bonded to and electrically connects pads 60 and 114, thereby electrically connecting LED chip 102 to terminal 30. Likewise, die attach 106 contacts and is sandwiched between and thermally connects and mechanically attaches cap 62 and thermal contact surface 112, thereby thermally connecting LED chip 102 to base 28.

Pad 60 is spot plated with nickel/silver to bond well with wire bond 104, thereby improving signal transfer from substrate 38 to chip 102, and cap 62 is spot plated with nickel/silver to bond well with die attach 106, thereby improving heat transfer from chip 102 to heat spreader 66. Pad 60 and cap 62 as spot plated with nickel/silver also provide a highly reflective surface which reflects the light emitted towards it by LED chip 102, thereby increasing light output in the upward direction. Furthermore, since cap 62 is shaped and sized to match thermal contact surface 112, thermal post 24 is not and need not be shaped and sized to match thermal contact surface 112.

Encapsulant 108 is a solid adherent electrically insulative color-shifting protective enclosure that provides environmental protection such as moisture resistance and particle protection for LED chip 102 and wire bond 104. LED chip 102 and wire bond 104 are embedded in encapsulant 108. Encapsulant 108 is transparent in FIG. 7B for convenience of illustration.

LED chip 102 includes a compound semiconductor that emits blue light, has high luminous efficiency and forms a p-n junction. Suitable compound semiconductors include gallium-nitride, gallium-arsenide, gallium-phosphide, gallium-arsenic-phosphide, gallium-aluminum-phosphide, gallium-aluminum-arsenide, indium-phosphide and indium-gallium-phosphide. LED chip 102 also has high light output and generates considerable heat.

Encapsulant 108 includes transparent silicone and yellow phosphor. For instance, the silicone can be polysiloxane resin and the yellow phosphor can be cerium-doped yttrium-aluminum-garnet (Ce:YAG) fluorescent powder. The yellow phosphor emits yellow light in response to blue light, and the blue and yellow light mix to produce white light. As a result, encapsulant 108 converts the blue light emitted by LED chip 102 into white light and assembly 100 is a white light source. In addition, encapsulant 108 has a hemisphere dome shape which provides a convex refractive surface that focuses the white light in the upward direction.

Semiconductor chip assembly 100 can be manufactured by mounting LED chip 102 on cap 62 using die attach 106, then wire bonding pads 60 and 114 and then forming encapsulant 108.

For instance, die attach 106 is initially a silver-filled epoxy paste with high thermal conductivity that is selectively screen printed on cap 62 and then LED chip 102 placed on the epoxy paste using a pick-up head and an automated pattern recognition system in step-and-repeat fashion. Thereafter, the epoxy paste is heated and hardened at a relatively low temperature such as 190° C. to form die attach 106. Next, wire bond 104 is a gold wire that is thermosonically ball bonded to pads 60 and 114 and then encapsulant 108 is molded on the structure.

LED chip 102 can be electrically connected to pad 60 by a wide variety of connection media, thermally connected to and mechanically attached to heat spreader 66 by a wide variety of thermal adhesives and encapsulated by a wide variety of encapsulants.

Semiconductor chip assembly 100 is a first-level single-chip package.

The semiconductor chip assemblies and thermal boards described above are merely exemplary. Numerous other embodiments are contemplated. In addition, the embodiments described above can be mixed-and-matched with one another and with other embodiments depending on design and reliability considerations. For instance, the substrate can include single-level conductive traces and multi-level conductive traces. The thermal board can include multiple posts arranged in an array for multiple semiconductor devices and can include additional conductive traces to accommodate the additional semiconductor devices. Likewise, the semiconductor device can be an LED package with multiple LED chips and the thermal board can include additional conductive traces to accommodate the additional LED chips. The semiconductor device can be flip-chip bonded to the pad and the cap by solder joints, overlap the substrate and cover the thermal post in the upward direction.

The semiconductor device can share or not share the heat spreader with other semiconductor devices. For instance, a single semiconductor device can be mounted on the heat spreader. Alternatively, numerous semiconductor devices can mounted on the heat spreader. For instance, four small chips in a 2×2 array can be attached to the thermal post and the substrate can include additional conductive traces to receive and route additional wire bonds to the chips. This may be more cost effective than providing a miniature thermal post for each chip.

The semiconductor chip can be optical or non-optical. For instance, the chip can be an LED, a solar cell, a microprocessor, a controller or an RF power amplifier. Likewise, the semiconductor package can be an LED package or an RF module. Thus, the semiconductor device can be a packaged or unpackaged optical or non-optical chip. Furthermore, the semiconductor device can be mechanically, electrically and thermally connected to the thermal board using a wide variety of connection media including solder and electrically and/or thermally conductive adhesive.

The heat spreader can provide rapid, efficient and essentially uniform heat spreading and dissipation for the semiconductor device to the next level assembly without heat flow through the adhesive, the substrate or elsewhere in the thermal board. As a result, the adhesive can have low thermal conductivity which drastically reduces cost. The heat spreader can include a thermal post and base that are integral with one another and a cap that is metallurgically bonded and thermally connected to the thermal post, thereby enhancing reliability and reducing cost. The cap can be coplanar with the pad, thereby facilitating the electrical, thermal and mechanical connections with the semiconductor device. Furthermore, the cap can be customized for the semiconductor device and the base can be customized for the next level assembly, thereby enhancing the thermal connection from the semiconductor device to the next level assembly. For instance, the thermal post can have a circular shape in a lateral plane and the cap can have a square or rectangular shape in a lateral plane with the same or similar topography as the thermal contact of the semiconductor device.

The heat spreader can be electrically connected to or isolated from the semiconductor device and the substrate. For instance, the second conductive layer on the grinded surface can include a routing line that extends across the adhesive between the substrate and the cap and electrically connects the semiconductor device to the heat spreader. Thereafter, the heat spreader can be electrically connected to ground, thereby electrically connecting the semiconductor device to ground.

The heat spreader can be copper, aluminum, copper/nickel/aluminum or other thermally conductive metallic structures.

The thermal post can be deposited on or integral with the base. The thermal post can be integral with the base when they are a single-piece metal such as copper or aluminum. The thermal post can also be integral with the base when they include a single-piece metal such as copper at their interface as well as additional metal elsewhere such as a solder upper post portion and a copper lower post portion and base. The thermal post can also be integral with the base when they share single-piece metals at their interface such as a copper coating on a nickel buffer layer on an aluminum core.

The signal post can be deposited on or integral with the terminal. The signal post can be integral with the terminal when they are a single-piece metal such as copper or aluminum. The signal post can also be integral with the terminal when they include a single-piece metal such as copper at their interface as well as additional metal elsewhere such as a solder upper post portion and a copper lower post portion and terminal. The signal post can also be integral with the terminal when they share single-piece metals at their interface such as a copper coating on a nickel buffer layer on an aluminum core.

The thermal post can include a flat top surface that is coplanar with the adhesive. For instance, the thermal post can be coplanar with the adhesive or the thermal post can be etched after the adhesive is solidified to provide a cavity in the adhesive over the thermal post. The thermal post can also be selectively etched to provide a cavity in the thermal post that extends below its top surface. In any case, the semiconductor device can be mounted on the thermal post and located in the cavity, and the wire bond can extend from the semiconductor device in the cavity to the pad outside the cavity. In this instance, the semiconductor device can be an LED chip and the cavity can focus the LED light in the upward direction.

The base can provide mechanical support for the substrate. For instance, the base can prevent the substrate from warping during metal grinding, chip mounting, wire bonding and encapsulant molding. Furthermore, the base can include fins at its backside that protrude in the downward direction. For instance, the base can be cut at its bottom surface by a routing machine to form lateral grooves that define the fins. In this instance, the base can have a thickness of 500 microns, the grooves can have a depth of 300 microns and the fins can have a height of 300 microns. The fins can increase the surface area of the base, thereby increasing the thermal conductivity of the base by thermal convection when it remains exposed to the air rather than mounted on a heat sink.

The metal plate can be etched to form the slot before, during or after the thermal post is formed. For instance, the metal plate can be etched to form the thermal post and then etched to form the slot and then the adhesive can be mounted on the base and the terminal. Alternatively, the metal plate can be etched to simultaneously form the thermal post and the slot and then the adhesive can be mounted on the base and the terminal. Alternatively, the metal plate can be etched to form the slot and then etched to form the thermal post and then the adhesive can be mounted on the base and the terminal.

The cap can be formed by numerous deposition techniques including electroplating, electroless plating, evaporating and sputtering as a single layer or multiple layers after the adhesive is solidified, either before, during or after the pad and/or the terminal is formed. The cap can be the same metal as the thermal post or the adjacent top of the thermal post. Furthermore, the cap can extend across the aperture to the substrate or reside within the periphery of the aperture. Thus, the cap may contact or be spaced from the substrate. In any case, the cap extends laterally from the top of the thermal post in the lateral directions.

The adhesive can provide a robust mechanical bond between the heat spreader and the substrate. For instance, the adhesive can extend laterally from the thermal post beyond the conductive trace to the peripheral edges of the assembly, the adhesive can fill the space between the heat spreader and the substrate and the adhesive can be void-free with consistent bond lines. The adhesive can also absorb thermal expansion mismatch between the heat spreader and the substrate. Furthermore, the adhesive can be a low cost dielectric that need not have high thermal conductivity. Moreover, the adhesive is not prone to delamination.

The adhesive thickness can be adjusted so that the adhesive essentially fills the slot and the gaps and essentially all the adhesive is within structure once it is solidified and/or grinded. For instance, the optimal prepreg thickness can be established through trial and error Likewise, the dielectric layer thickness can be adjusted to achieve this result.

The substrate can be a low cost laminated structure that need not have high thermal conductivity. Furthermore, the substrate can include a single conductive layer or multiple conductive layers. Moreover, the substrate can include or consist of the conductive layer.

The conductive layer alone can be mounted on the adhesive. For instance, the apertures can be formed in the conductive layer and then the conductive layer can be mounted on the adhesive so that the conductive layer contacts the adhesive and is exposed in the upward direction and the posts extend into and are exposed in the upward direction by the apertures. In this instance, the conductive layer can have a thickness of 100 to 200 microns such as 125 microns which is thick enough to handle without warping and wobbling yet thin enough to pattern without excessive etching.

The conductive layer and the dielectric layer can be mounted on the adhesive. For instance, the conductive layer can be provided on the dielectric layer, then the apertures can be formed in the conductive layer and the dielectric layer, and then the conductive layer and the dielectric layer can be mounted on the adhesive so that the conductive layer is exposed in the upward direction, the dielectric layer contacts and is sandwiched between and separates the conductive layer and the adhesive and the posts extend into and are exposed in the upward directions by the apertures. In this instance, the conductive layer can have a thickness of 10 to 50 microns such as 30 microns which is thick enough for reliable signal transfer yet thin enough to reduce weight and cost. Furthermore, the dielectric layer is a permanent part of the thermal board.

The conductive layer and a carrier can be mounted on the adhesive. For instance, the conductive layer can be attached to a carrier such biaxially-oriented polyethylene terephthalate polyester (Mylar) by a thin film, then the apertures can be formed in the conductive layer but not the carrier, then the conductive layer and the carrier can be mounted on the adhesive so that the carrier covers the conductive layer and is exposed in the upward direction, the thin film contacts and is sandwiched between the carrier and the conductive layer, the conductive layer contacts and is sandwiched between the thin film and the adhesive, and the posts are aligned with the apertures and covered in the upward direction by the carrier. After the adhesive is solidified, the thin film can be decomposed by UV light so that the carrier can be peeled off the conductive layer, thereby exposing the conductive layer in the upward direction, and then the conductive layer can be grinded and patterned to provide the conductive trace. In this instance, the conductive layer can have a thickness of 10 to 50 microns such as 30 microns which is thick enough for reliable signal transfer yet thin enough to reduce weight and cost, and the carrier can have a thickness of 300 to 500 microns which is thick enough to handle without warping and wobbling yet thin enough to reduce weight and cost. Furthermore, the carrier is a temporary fixture and not a permanent part of the thermal board.

The pad and the terminal can have a wide variety of packaging formats as required by the semiconductor device and the next level assembly.

The pad and the cap can be coplanar at their top surfaces, thereby enhancing solder joints between the semiconductor device and the thermal board by controlling solder ball collapse.

The pad can be formed by numerous deposition techniques including electroplating, electroless plating, evaporating and sputtering as a single layer or multiple layers, either before or after the substrate is mounted on the adhesive. For instance, the conductive layer can be patterned on the substrate before it is mounted on the adhesive or after it is attached to the posts, the base and the terminal by the adhesive.

The plated contact surface finish can be formed before or after the pad and the terminal are formed. For instance, the plated layer can be deposited on the metal plate before it is etched. Alternatively, the plated layer can be deposited on the second conductive layer and then patterned using the etch mask that defines the pad and the cap.

The conductive trace can include additional pads, terminals, vias, signal posts and routing lines as well as passive components and have different configurations. The conductive trace can function as a signal, power or ground layer depending on the purpose of the corresponding semiconductor device pad. The conductive trace can also include various conductive metals such as copper, gold, nickel, silver, palladium, tin, combinations thereof, and alloys thereof. The preferred composition will depend on the nature of the external connection media as well as design and reliability considerations. Furthermore, those skilled in the art will understand that in the context of a semiconductor chip assembly, the copper material can be pure elemental copper but is typically a copper alloy that is mostly copper such as copper-zirconium (99.9% copper), copper-silver-phosphorus-magnesium (99.7% copper) and copper-tin-iron-phosphorus (99.7% copper) to improve mechanical properties such as tensile strength and elongation.

The cap, dielectric layer, encapsulant, plated contacts and second conductive layer on the grinded top surface are generally desirable but may be omitted in some embodiments. For instance, if the opening and aperture are punched rather than drilled so that the top of the thermal post is shaped and sized to accommodate a thermal contact surface of the semiconductor device then the cap and the second conductive layer may be omitted to reduce cost Likewise, the dielectric layer may be omitted to reduce cost.

The thermal board can include a thermal via that is spaced from the posts, extends through the dielectric layer and the adhesive outside the openings and the apertures and is adjacent to and thermally connects the base and the cap to improve heat dissipation from the cap to the base and heat spreading in the base.

The assembly can provide horizontal or vertical single-level or multi-level signal routing.

Horizontal single-level signal routing with the pad, the terminal and the routing line above the dielectric layer is disclosed in U.S. application Ser. No. 12/616,773 filed Nov. 11, 2009 by Charles W. C. Lin et al. entitled "Semiconductor Chip Assembly with Post/Base Heat Spreader and Substrate" which is incorporated by reference.

Horizontal single-level signal routing with the pad, the terminal and the routing line above the adhesive and no dielectric layer is disclosed in U.S. application Ser. No. 12/616,775 filed Nov. 11, 2009 by Charles W. C. Lin et al. entitled "Semiconductor Chip Assembly with Post/Base Heat Spreader and Conductive Trace" which is incorporated by reference.

Horizontal multi-level signal routing with the pad and the terminal above the dielectric layer electrically connected by first and second vias through the dielectric layer and a routing line beneath the dielectric layer is disclosed in U.S. application Ser. No. 12/557,540 filed Sep. 11, 2009 by Chia-Chung Wang et al. entitled "Semiconductor Chip Assembly with Post/Base Heat Spreader and Horizontal Signal Routing" which is incorporated by reference.

Vertical multi-level signal routing with the pad above the dielectric layer and the terminal beneath the adhesive electrically connected by a first via through the dielectric layer, a routing line beneath the dielectric layer and a second via through the adhesive is disclosed in U.S. application Ser. No. 12/557,541 filed Sep. 11, 2009 by Chia-Chung Wang et al. entitled "Semiconductor Chip Assembly with Post/Base Heat Spreader and Vertical Signal Routing" which is incorporated by reference.

The working format for the thermal board can be a single thermal board or multiple thermal boards based on the manufacturing design. For instance, a single thermal board can be manufactured individually. Alternatively, numerous thermal boards can be simultaneously batch manufactured using a single metal plate, a single adhesive and a single substrate and then separated from one another. Likewise, numerous sets of heat spreaders and conductive traces that are each dedicated to a single semiconductor device can be simultaneously batch manufactured for each thermal board in the batch using a single metal plate, a single adhesive and a single substrate.

For example, multiple recesses and slots can be etched in the metal plate to form multiple thermal posts, signal posts, bases and terminals, then the non-solidified adhesive with openings corresponding to the posts can be mounted on the bases and the terminals such that each post extends through an opening, then the substrate (with a single conductive layer, a single dielectric layer and apertures corresponding to the posts) can be mounted on the adhesive such that each post extends through an opening into an aperture, then the bases and the terminals can be moved toward the substrate by platens to force the adhesive into the slots between the bases and the terminals and into the gaps in the apertures between the posts and the substrate, then the adhesive can be cured and solidified, then the posts, the adhesive and the first conductive layer can be grinded to form a planarized lateral top surface and the adhesive, the bases and the terminals can be grinded to form a planarized lateral bottom surface, then the second conductive layer can be plated on the posts, the adhesive and the first conductive layer and the third conductive layer can be plated on the adhesive, the bases and the terminals, then the first and second conductive layers can be etched to form the pads corresponding to the signal posts and the caps corresponding to the thermal posts and the third conductive layer can be removed, then the plated contact surface finish can be formed on the pads, the caps the bases and the terminals and then the substrate, the adhesive, the bases and the terminals can be cut or cracked at the desired locations of the peripheral edges of the thermal boards, thereby separating the individual thermal boards from one another.

The working format for the semiconductor chip assembly can be a single assembly or multiple assemblies based on the manufacturing design. For instance, a single assembly can be manufactured individually. Alternatively, numerous assemblies can be simultaneously batch manufactured before the thermal boards are separated from one another. Likewise, multiple semiconductor devices can be electrically, thermally and mechanically connected to each thermal board in the batch.

For example, solder paste portions can be deposited on the pads and the caps, then LED packages can be placed on the solder paste portions, then the solder paste portions can be simultaneously heated, reflowed and hardened to provide the solder joints and then the thermal boards can be separated from one another.

As another example, die attach paste portions can be deposited on the caps, then chips can be placed on the die attach paste portions, then the die attach paste portions can be simultaneously heated and hardened to provide the die attaches, then the chips can be wired bonded to the corresponding pads, then the encapsulants can be formed over the chips and the wire bonds and then the thermal boards can be separated from one another.

The thermal boards can be detached from one another in a single step or multiple steps. For instance, the thermal boards can be batch manufactured as a panel, then the semiconductor devices can be mounted on the panel and then the semiconductor chip assemblies of the panel can be detached from one another. Alternatively, the thermal boards can be batch manufactured as a panel, then the thermal boards of the panel can be singulated into strips of multiple thermal boards, then the semiconductor devices can be mounted on the thermal boards of a strip and then the semiconductor chip assemblies of the strip can be detached from one another. Furthermore, the thermal boards can be detached by mechanical sawing, laser sawing, cleaving or other suitable techniques.

The term "adjacent" refers to elements that are integral (single-piece) or in contact (not spaced or separated from) with one another. For instance, the thermal post is adjacent to the base regardless of whether the thermal post is formed additively or subtractively.

The term "overlap" refers to above and extending within a periphery of an underlying element. Overlap includes extending inside and outside the periphery or residing within the periphery. For instance, the semiconductor device overlaps the thermal post since an imaginary vertical line intersects the semiconductor device and the thermal post, regardless of whether another element such as the cap is between the semiconductor device and the thermal post and is intersected by the line, and regardless of whether another imaginary vertical line intersects the semiconductor device but not the thermal post (outside the periphery of the thermal post). Likewise, the adhesive overlaps the base and is overlapped by the pad, and the base is overlapped by the thermal post. Likewise, the thermal post overlaps and is within a periphery of the base. Moreover, overlap is synonymous with over and overlapped by is synonymous with under or beneath.

The term "contact" refers to direct contact. For instance, the dielectric layer contacts the pad but does not contact the thermal post or the base.

The term "cover" refers to complete coverage in the upward, downward and/or lateral directions. For instance, the base covers the thermal post in the downward direction but the thermal post does not cover the base in the upward direction.

The term "layer" refers to patterned and unpatterned layers. For instance, the conductive layer can be an unpatterned blanket sheet on the dielectric layer when the substrate is mounted on the adhesive, and the conductive layer can be a patterned circuit with spaced traces on the dielectric layer when the semiconductor device is mounted on the heat spreader. Furthermore, a layer can include stacked layers.

The term "pad" in conjunction with the conductive trace refers to a connection region that is adapted to contact and/or bond to external connection media (such as solder or a wire bond) that electrically connects the conductive trace to the semiconductor device.

The term "terminal" in conjunction with the conductive trace refers to a connection region that is adapted to contact and/or bond to external connection media (such as solder or a wire bond) that electrically connects the conductive trace to an external device (such as a PCB or a wire thereto) associated with the next level assembly.

The term "cap" in conjunction with the heat spreader refers to a contact region that is adapted to contact and/or bond to external connection media (such as solder or thermally conductive adhesive) that thermally connects the heat spreader to the semiconductor device.

The terms "opening" and "aperture" and "slot" refer to a through-hole and are synonymous. For instance, the thermal post is exposed by the adhesive in the upward direction when it is inserted into the opening in the adhesive. Likewise, the thermal post is exposed by the substrate in the upward direction when it is inserted into the aperture in the substrate. In addition, the adhesive is exposed by the metal plate in the downward direction when it is mounted on the base and the terminal and covers the slot in the upward direction.

The term "inserted" refers to relative motion between elements. For instance, the thermal post is inserted into the aperture regardless of whether the thermal post is stationary and the substrate moves towards the base, the substrate is stationary and the thermal post moves towards the substrate or the thermal post and the substrate both approach the other. Furthermore, the thermal post is inserted (or extends) into the aperture regardless of whether it goes through (enters and exits) or does not go through (enters without exiting) the aperture.

The phrase "move towards one another" also refers to relative motion between elements. For instance, the base and the substrate move towards one another regardless of whether the base is stationary and the substrate moves towards the base, the substrate is stationary and the base moves towards the substrate or the base and the substrate both approach the other.

The phrase "aligned with" refers to relative position between elements. For instance, the thermal post is aligned with the aperture when the adhesive is mounted on the base, the substrate is mounted on the adhesive, the thermal post is inserted into and aligned with the opening and the aperture is aligned with the opening regardless of whether the thermal post is inserted into the aperture or is below and spaced from the aperture.

The phrase "mounted on" includes contact and non-contact with a single or multiple support element(s). For instance, the semiconductor device is mounted on the heat spreader regardless of whether it contacts the heat spreader or is separated from the heat spreader by a die attach Likewise, the semiconductor device is mounted on the heat spreader regardless of whether it is mounted on the heat spreader alone or the heat spreader and the substrate.

The phrase "adhesive . . . in the gap" refers to the adhesive in the gap. For instance, adhesive that extends across the dielectric layer in the gap refers to the adhesive in the gap that extends across the dielectric layer. Likewise, adhesive that contacts and is sandwiched between the thermal post and the dielectric layer in the gap refers to the adhesive in the gap that contacts and is sandwiched between the thermal post at the inner sidewall of the gap and the dielectric layer at the outer sidewall of the gap.

The term "above" refers to upward extension and includes adjacent and non-adjacent elements as well as overlapping and non-overlapping elements. For instance, the thermal post extends above, is adjacent to, overlaps and protrudes from the base Likewise, the thermal post extends above the dielectric layer even though it is not adjacent to or overlap the dielectric layer.

The term "below" refers to downward extension and includes adjacent and non-adjacent elements as well as overlapping and non-overlapping elements. For instance, the base extends below, is adjacent to, is overlapped by and protrudes from the thermal post Likewise, the thermal post extends below the dielectric layer even though it is not adjacent to or overlapped by the dielectric layer.

The "upward" and "downward" vertical directions do not depend on the orientation of the semiconductor chip assembly (or the thermal board), as will be readily apparent to those skilled in the art. For instance, the thermal post extends vertically above the base in the upward direction and the adhesive extends vertically below the pad in the downward direction regardless of whether the assembly is inverted and/or mounted on a heat sink. Likewise, the base extends "laterally" from the thermal post in a lateral plane regardless of whether the assembly is inverted, rotated or slanted. Thus, the upward and downward directions are opposite one another and orthogonal to the lateral directions, and laterally aligned elements are coplanar with one another at a lateral plane orthogonal to the upward and downward directions.

The semiconductor chip assembly of the present invention has numerous advantages. The assembly is reliable, inexpensive and well-suited for high volume manufacture. The assembly is especially well-suited for high power semiconductor devices such as LED chips and large semiconductor chips as well as multiple semiconductor devices such as small semiconductor chips in arrays which generate considerable heat and require excellent heat dissipation in order to operate effectively and reliably.

The manufacturing process is highly versatile and permits a wide variety of mature electrical, thermal and mechanical connection technologies to be used in a unique and improved manner. The manufacturing process can also be performed without expensive tooling. As a result, the manufacturing process significantly enhances throughput, yield, performance and cost effectiveness compared to conventional packaging techniques. Moreover, the assembly is well-suited for copper chip and lead-free environmental requirements.

The embodiments described herein are exemplary and may simplify or omit elements or steps well-known to those skilled in the art to prevent obscuring the present invention Likewise, the drawings may omit duplicative or unnecessary elements and reference labels to improve clarity.

Various changes and modifications to the embodiments described herein will be apparent to those skilled in the art. For instance, the materials, dimensions, shapes, sizes, steps and arrangement of steps described above are merely exemplary. Such changes, modifications and equivalents may be made without departing from the spirit and scope of the present invention as defined in the appended claims.

We claim:

1. A semiconductor chip assembly, comprising:
a semiconductor device;
an adhesive that includes first and second openings;
a heat spreader that includes a thermal post and a base, wherein the thermal post is adjacent to and integral with the base and extends above the base in an upward direction, and the base extends below the thermal post in a downward direction opposite the upward direction, covers the thermal post in the downward direction and extends laterally from the thermal post in lateral directions orthogonal to the upward and downward directions; and
a conductive trace that includes a pad, a terminal and a signal post, wherein the signal post extends below the pad and above the terminal and an electrically conductive path between the pad and the terminal includes the signal post;
wherein the semiconductor device overlaps the thermal post, is electrically connected to the pad and thereby electrically connected to the terminal, and is thermally connected to the thermal post and thereby thermally connected to the base;
wherein the adhesive is mounted on and extends above the base and the terminal, extends laterally from the thermal post to or beyond the terminal and extends laterally between the base and the terminal;
wherein the pad extends above the signal post and the terminal extends below the signal post; and
wherein the thermal post extends into the first opening, the signal post extends into the second opening, the posts are the same metallic material and have the same thickness and are coplanar with one another, and the base and the terminal are the same metallic material and have the same thickness and are coplanar with one another.

2. The assembly of claim 1, wherein the semiconductor device is an LED chip.

3. The assembly of claim 1, wherein the semiconductor device is electrically connected to the pad using a wire bond and is thermally connected to the heat spreader using a die attach.

4. The assembly of claim 1, wherein the adhesive contacts the posts, the base and the terminal.

5. The assembly of claim 1, wherein the adhesive covers and surrounds the posts in the lateral directions.

6. The assembly of claim 1, wherein the adhesive conformally coats sidewalls of the posts, the base and the terminal.

7. The assembly of claim 1, wherein the adhesive is coplanar with tops of the posts.

8. The assembly of claim 1, wherein the adhesive extends laterally from the thermal post beyond the terminal.

9. The assembly of claim 1, wherein the adhesive extends to peripheral edges of the assembly.

10. The assembly of claim 1, wherein the posts are coplanar with the adhesive between top and bottom surfaces of the pad.

11. The assembly of claim 1, wherein the thermal post has a diameter that decreases as it extends upwardly from the base to its flat top, and the signal post has a diameter that decreases as it extends upwardly from the terminal to its flat top.

12. The assembly of claim 1, wherein the thermal post fills and is contained within the first opening and the signal post fills and is contained within the second opening.

13. The assembly of claim 1, wherein the terminal is adjacent to and integral with and located below the signal post and extends laterally from the signal post in the lateral directions.

14. The assembly of claim 1, wherein the base covers the thermal post in the downward direction, supports the adhesive and is spaced from peripheral edges of the assembly.

15. The assembly of claim 1, wherein the heat spreader includes a cap that extends is above and is adjacent to and covers in the upward direction and extends laterally in the lateral directions from a top of the thermal post and that contacts and overlaps the adhesive.

16. A semiconductor chip assembly, comprising:
a semiconductor device;
an adhesive that includes first and second openings;
a heat spreader that includes a thermal post and a base, wherein the thermal post is adjacent to and integral with the base and extends above the base in an upward direction, and the base extends below the thermal post in a downward direction opposite the upward direction, covers the thermal post in the downward direction and extends laterally from the thermal post in lateral directions orthogonal to the upward and downward directions;
a substrate that includes a dielectric layer, wherein first and second apertures extend through the substrate; and
a conductive trace that includes a pad, a terminal and a signal post, wherein the signal post is adjacent to the pad and the terminal, extends below the pad and extends above the terminal and an electrically conductive path between the pad and the terminal includes the signal post;
wherein the semiconductor device is mounted on the heat spreader, overlaps the thermal post, does not overlap the signal post, is electrically connected to the pad and thereby electrically connected to the terminal, and is thermally connected to the thermal post and thereby thermally connected to the base;
wherein the adhesive is mounted on and extends above the base and the terminal, extends between the thermal post and the substrate, extends between the signal post and the substrate, extends laterally from the thermal post to or beyond the terminal, extends laterally between the base and the terminal below and outside peripheries of the posts and is sandwiched between the thermal post and the dielectric layer, between the signal post and the dielectric layer, between the base and the dielectric layer, between the terminal and the dielectric layer and between the base and the terminal;
wherein the substrate is mounted on the adhesive and extends above the base and the terminal;
wherein the pad extends above the adhesive, the dielectric layer and the signal post and the terminal extends below the dielectric layer and the signal post; and
wherein the thermal post extends into the first opening and the first aperture, the signal post extends into the second opening and the second aperture, the posts are the same metallic material and have the same thickness and are coplanar with one another, and the base and the terminal are the same metallic material and have the same thickness and are coplanar with one another.

17. The assembly of claim 16, wherein the semiconductor device is an LED chip.

18. The assembly of claim 16, wherein the semiconductor device is a semiconductor chip, is mounted on the heat spreader using a die attach, is electrically connected to the pad using a wire bond and is thermally connected to the heat spreader using the die attach.

19. The assembly of claim 16, wherein the adhesive contacts the posts, the base, the terminal and the dielectric layer.

20. The assembly of claim 16, wherein the adhesive covers and surrounds the posts in the lateral directions, conformally coats sidewalls of the posts, the base and the terminal, surrounds the base in the lateral directions and does not surround the terminal in the lateral directions.

21. The assembly of claim 16, wherein the adhesive extends to peripheral edges of the assembly.

22. The assembly of claim 16, wherein the adhesive is coplanar with tops of the posts.

23. The assembly of claim 16, wherein the posts are coplanar with the adhesive above the dielectric layer.

24. The assembly of claim 16, wherein the posts are coplanar with the adhesive between top and bottom surfaces of the pad.

25. The assembly of claim 16, wherein the thermal post has a diameter that decreases as it extends upwardly from the base to its flat top, and the signal post has a diameter that decreases as it extends upwardly from the terminal to its flat top.

26. The assembly of claim 16, wherein the thermal post fills and is contained within the first opening and the signal post fills and is contained within the second opening.

27. The assembly of claim 16, wherein the thermal post and the adhesive in combination fill the first aperture and the signal post and the adhesive in combination fill the second aperture, the conductive trace is spaced from the heat spreader, the pad contacts the dielectric layer, the terminal contacts the adhesive and is spaced from the dielectric layer and the posts contact the adhesive and are spaced from the dielectric layer.

28. The assembly of claim 16, wherein the substrate is a laminated structure that includes the pad.

29. The assembly of claim 16, wherein a cap extends above and is adjacent to and covers in the upward direction and extends laterally in the lateral directions from a top of the thermal post and contacts and overlaps the adhesive and the dielectric layer.

30. The assembly of claim 29, wherein the cap is coplanar with the pad above the adhesive and the dielectric layer, covers the opening and the aperture in the upward direction and is adjacent to the thermal post between top and bottom surfaces of the pad.

31. A semiconductor chip assembly, comprising:
a semiconductor device;
an adhesive that includes first and second openings;
a heat spreader that includes a thermal post, a base and a cap, wherein the thermal post is adjacent to and integral with the base, extends above the base in an upward direction and thermally connects the base and the cap, the base extends below the thermal post in a downward direction opposite the upward direction, covers the thermal post in the downward direction and extends laterally from the thermal post in lateral directions orthogonal to the upward and downward directions, and the cap extends above and is adjacent to and covers in the upward direction and extends laterally in the lateral directions from a top of the thermal post;
a substrate that includes a dielectric layer, wherein first and second apertures extend through the substrate; and
a conductive trace that includes a pad, a terminal and a signal post, wherein the signal post is adjacent to the pad and the terminal, extends below the pad and extends above the terminal and an electrically conductive path between the pad and the terminal includes the signal post;
wherein the semiconductor device is mounted on the cap, overlaps the thermal post, does not overlap the signal post, is electrically connected to the pad and thereby electrically connected to the terminal, and is thermally connected to the cap and thereby thermally connected to the base;
wherein the adhesive is mounted on and extends above the base and the terminal, extends into a first gap in the first aperture between the thermal post and the substrate and into a second gap in the second aperture between the signal post and the substrate, extends across the dielectric layer in the gaps, extends laterally from the thermal post to or beyond the terminal, extends laterally between the base and the terminal below the posts and outside peripheries of the posts, the base and the terminal, extends to peripheral edges of the assembly, covers and surrounds the posts in the lateral directions and contacts and is sandwiched between the thermal post and the dielectric layer in the first gap, between the signal post and the dielectric layer in the second gap, between the base and the dielectric layer outside the gaps, between the terminal and the dielectric layer outside the gaps and between the base and the terminal outside the gaps;
wherein the substrate is mounted on the adhesive and extends above the base and the terminal and the dielectric layer contacts the pad and is spaced from the posts, the base and the terminal;
wherein the pad extends above the adhesive, the dielectric layer and the signal post and the terminal extends below the dielectric layer and the signal post; and
wherein the thermal post extends into the first opening and the first aperture, the signal post extends into the second opening and the second aperture, the cap contacts and overlaps the adhesive and the dielectric layer and is coplanar with the pad above the adhesive and the dielectric layer at a surface that faces in the upward direction, the posts are the same metallic material and have the same thickness and are coplanar with one another and extend through the dielectric layer, and the base and the terminal are the same metallic material and have the same thickness and are coplanar with one another.

32. The assembly of claim 31, wherein the posts are coplanar with the adhesive above the dielectric layer between top and bottom surfaces of the pad.

33. The assembly of claim 31, wherein the thermal post fills and is contained within the first opening, the signal post fills and is contained within the second opening, the thermal post and the adhesive in combination fill the first aperture, the signal post and the adhesive in combination fill the second aperture and the posts are copper.

34. The assembly of claim 31, wherein the thermal post has a diameter that decreases as it extends upwardly from the base to the cap, the signal post has a diameter that decreases as it extends upwardly from the terminal to the pad.

35. The assembly of claim 31, wherein the cap and the pad are the same metallic material, have the same thickness where closest to one another and have different thickness where the cap is adjacent to the thermal post and the adhesive is essentially coplanar with the base and the terminal below the posts at a surface that faces in the downward direction.

* * * * *